(12) United States Patent
Kuo

(10) Patent No.: US 11,430,935 B2
(45) Date of Patent: Aug. 30, 2022

(54) LIGHT EMITTING DIODE STRUCTURE

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 17/134,549

(22) Filed: Dec. 28, 2020

(65) Prior Publication Data

US 2021/0119096 A1 Apr. 22, 2021

Related U.S. Application Data

(62) Division of application No. 16/541,132, filed on Aug. 14, 2019, now Pat. No. 10,944,034.

(30) Foreign Application Priority Data

Aug. 24, 2018 (TW) .................................. 107129676

(51) Int. Cl.
*H01L 33/62* (2010.01)
*H01L 33/22* (2010.01)
*H01L 33/52* (2010.01)
*H01L 33/42* (2010.01)

(52) U.S. Cl.
CPC .............. *H01L 33/62* (2013.01); *H01L 33/22* (2013.01); *H01L 33/42* (2013.01); *H01L 33/52* (2013.01)

(58) Field of Classification Search
CPC ......... H01L 33/22; H01L 33/42; H01L 33/52; H01L 33/62
See application file for complete search history.

(56) References Cited

U.S. PATENT DOCUMENTS

| | | |
|---|---|---|
| 5,286,335 A | 2/1994 | Drabik et al. |
| 6,614,058 B2 | 9/2003 | Lin et al. |
| 7,217,956 B2 | 5/2007 | Daniels et al. |
| 7,317,211 B2 | 1/2008 | Watanabe et al. |
| 8,048,696 B2 | 11/2011 | Shiue et al. |

(Continued)

FOREIGN PATENT DOCUMENTS

| | | |
|---|---|---|
| CN | 1761077 A | 4/2006 |
| GN | 205944139 U | 2/2017 |

(Continued)

*Primary Examiner* — Peniel M Gumedzoe
(74) *Attorney, Agent, or Firm* — CKC & Partners Co., LLC

(57) ABSTRACT

A light emitting diode includes a base layer, an electric contact layer, a semiconductor stack, and an insulation layer. The base layer has a maximum of a first width. The electric contact layer has a maximum of a second width and is disposed on the base layer. The semiconductor stack disposed on the electric contact layer has a maximum of a third width, and includes a first type semiconductor layer, a light emitting layer, and a second type semiconductor layer stacked in sequence, wherein a width of the first type semiconductor layer is smaller than the maximum of the third width. The insulation layer covers the sidewalls of the base layer, the electric contact layer, and the semiconductor stack. The maximum of the second width is greater than the maximum of the third width and the maximum of the second width is less than the maximum of the first width.

8 Claims, 29 Drawing Sheets

(56) References Cited

U.S. PATENT DOCUMENTS

| | | |
|---|---|---|
| 8,207,547 B2 | 6/2012 | Lin |
| 8,309,979 B2 | 11/2012 | McKenzie et al. |
| 8,431,422 B2 | 4/2013 | Herrmann |
| 8,653,542 B2 | 2/2014 | Hsia et al. |
| 8,835,940 B2 | 9/2014 | Hu et al. |
| 8,865,489 B2 | 10/2014 | Rogers et al. |
| 9,368,683 B1 | 6/2016 | Meitl et al. |
| 9,640,715 B2 | 5/2017 | Bower et al. |
| 2007/0058059 A1 | 3/2007 | Suehiro |
| 2008/0142813 A1 | 6/2008 | Chang et al. |
| 2010/0201280 A1* | 8/2010 | McKenzie .............. H01L 33/46 315/246 |
| 2011/0089401 A1 | 4/2011 | Hiraiwa et al. |
| 2012/0153304 A1 | 6/2012 | Schubert et al. |
| 2013/0069095 A1 | 3/2013 | Hodota et al. |
| 2013/0313591 A1 | 11/2013 | Shimada et al. |
| 2015/0115290 A1 | 4/2015 | Guenard |
| 2015/0263242 A1 | 9/2015 | Tomizawa et al. |
| 2017/0025563 A1 | 1/2017 | Meitl et al. |
| 2017/0133818 A1 | 5/2017 | Cok |
| 2017/0288088 A1 | 10/2017 | Won Cheol |

FOREIGN PATENT DOCUMENTS

| | | |
|---|---|---|
| GN | 107681034 A | 2/2018 |
| JP | 6-45650 A | 2/1994 |
| JP | 2005-259820 A | 9/2005 |
| JP | 2007-103917 A | 4/2007 |
| JP | 2007-517404 A | 6/2007 |
| JP | 2008-66442 A | 3/2008 |
| JP | 2010-27768 A | 2/2010 |
| JP | 2013-69843 A | 4/2013 |
| JP | 2014-44971 A | 3/2014 |
| JP | 2016-15467 A | 1/2016 |
| JP | 2016-167512 A | 9/2016 |
| TW | 201205871 A1 | 2/2012 |
| TW | 201349585 A | 12/2013 |
| TW | 201535798 A | 9/2015 |

* cited by examiner

LIGHT EMITTING DIODE STRUCTURE

CROSS-REFERENCE TO RELATED APPLICATION

The present application is a Divisional Application of the U.S. application Ser. No. 16/541,132, filed Aug. 14, 2019, which claims priority to Taiwan Application Serial Number 107129676, filed Aug. 24, 2018, which is herein incorporated by reference.

BACKGROUND

Field of Invention

The present invention relates to a light emitting diode structure.

Description of Related Art

As comparing to the conventional light emitting diode, the size of the micro light emitting diode (micro LED) is reduced to a level of micron meters (μm), and the target yield of manufacturing the micro LEDs is aimed to be over 99%. However, conventional processes of fabricating micro LEDs face various technical challenges, in which the mass transfer technology is the most crucial process. Furthermore, many other technical problems need to be resolved, for example the precision of the equipment, the transfer yields, the transfer time, the rework property, and the processing cost.

For example, the current technology for manufacturing a micro light emitting diode is to first define a micro light emitting diode structure by processes, and then the micro light emitting diode structure is bonded to a first temporary substrate and the sapphire substrate is removed by laser lift-off (LLO) technology. The micro light emitting diode structure is then bonded to a second temporary substrate by using a bonding material. Next, after removing the first temporary substrate and manufacturing a supporter structure, the bonding material is etched, and the epitaxial structure in the micro light emitting diode structure is finally transferred. In the processes above, it requires two times of bonding the temporary substrate and two times of removing the temporary substrate. In addition to the poor control of the yield loss, after the stress of the epitaxial structure is released, the spacing pitch between the micro light emitting diodes is also different from the original design, thereby causing the alignment problem during the transfer.

SUMMARY

One aspect of the present invention provides a light emitting diode structure. The light emitting diode structure includes a base layer, an electric contact layer, a semiconductor stack, and an insulation layer. The base layer has a maximum of a first width. The electric contact layer has a maximum of a second width and is disposed on the base layer. The semiconductor stack has a maximum of a third width and is disposed on the electric contact layer. The semiconductor stack includes a first type semiconductor layer, a light emitting layer, and a second type semiconductor layer stacked in sequence, wherein a width of the first type semiconductor layer, a width of the light emitting layer, and a width of the second type semiconductor layer are substantially smaller than or equal to the maximum of the third width. The insulation layer covers at least a sidewall of the base layer, a sidewall of the electric contact layer, and a sidewall of the semiconductor stack. The maximum of the second width is greater than the maximum of the third width and the maximum of the second width is less than or equal to the maximum of the first width.

According to some embodiments of the present disclosure, the electric contact layer is a single layer. The maximum of the second width is substantially equal to the maximum of the first width.

According to some embodiments of the present disclosure, the electric contact layer includes an ohmic contact layer and a first metal layer. The ohmic contact layer with a maximum of a fourth width is disposed between the semiconductor stack and the base layer and the first metal layer with a maximum of a fifth width is disposed between the ohmic contact layer and the base layer. The maximum of the fourth width is smaller than or substantially equal to the maximum of the first width and the maximum of the fifth width is substantially equal to the maximum of the first width.

According to some embodiments of the present disclosure, the maximum of the fourth width is substantially equal to the maximum of the third width.

According to some embodiments of the present disclosure, the light emitting diode structure further includes an electrode layer disposed on the semiconductor stack.

According to some embodiments of the present disclosure, the electrode layer is transparent for a light emitted from the light emitting layer.

According to some embodiments of the present disclosure, the electrode layer is a second metal layer.

According to some embodiments of the present disclosure, the base layer includes a dielectric material or a metal material.

According to some embodiments of the present disclosure, the base layer includes a distributed bragg reflector and the insulation layer covers at least a sidewall of the distributed bragg reflector.

According to some embodiments of the present disclosure, the electric contact layer is transparent for a light emitted by the light emitting layer.

Another aspect of the present invention provides a light emitting diode structure. The light emitting diode structure includes a semiconductor stack, an insulation layer, a first conductive pad, a second conductive pad, and a supporting breakpoint. The semiconductor stack includes a first type semiconductor layer, a light emitting layer, and a second type semiconductor layer stacked from top to bottom in sequence, wherein the second type semiconductor layer comprises a first portion and a second portion and the first portion is disposed on the second portion. A maximum width of the second portion is greater than a maximum width of the first portion. The insulation layer covers a sidewall of the semiconductor stack and an upper surface of the second portion. The insulation layer has a first opening and a second opening respectively located on the first type semiconductor layer and the second portion. The first conductive pad is electrically connected to the first type semiconductor layer through the first opening. The second conductive pad is electrically connected to the second portion through the second opening. The supporting breakpoint is disposed over the insulation layer and between the first conductive pad and the second conductive pad.

According to some embodiments of the present disclosure, the light emitting diode structure further includes a bonding substrate electrically connected to the first conductive pad and the second conductive pad.

According to some embodiments of the present disclosure, the light emitting diode structure further includes a first adhesive layer and a second adhesive layer. The first adhesive layer is disposed between the first conductive pad and the bonding substrate, the second adhesive layer is disposed between the second conductive pad and the bonding substrate, and the first adhesive layer is electrically insulated from the second adhesive layer.

According to some embodiments of the present disclosure, the light emitting diode structure further includes an electrode layer disposed between the first type semiconductor layer and the first conductive pad.

According to some embodiments of the present disclosure, the light emitting diode structure further includes a conductive block disposed in the second opening, in which the second conductive pad covers a sidewall and a top surface of the conductive block.

According to some embodiments of the present disclosure, a top surface of the insulation layer positioned on the first portion of the second type semiconductor layer is substantially level with the top surface of the conductive block.

According to some embodiments of the present disclosure, the first conductive pad extends to cover a portion of the insulation layer.

According to some embodiments of the present disclosure, a top surface of the first conductive pad is substantially level with a top surface of the second conductive pad.

According to some embodiments of the present disclosure, the second type semiconductor layer has a surface exposed outside and the surface has a rough texture.

BRIEF DESCRIPTION OF THE DRAWINGS

The invention can be more fully understood by reading the following detailed description of the embodiment, with reference made to the accompanying drawings as follows:

FIG. 36 to FIG. 38A are cross-sectional views illustrating various process stages of manufacturing the light emitting diode structure, along line A-A' in FIG. 35.

DETAILED DESCRIPTION

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1A:
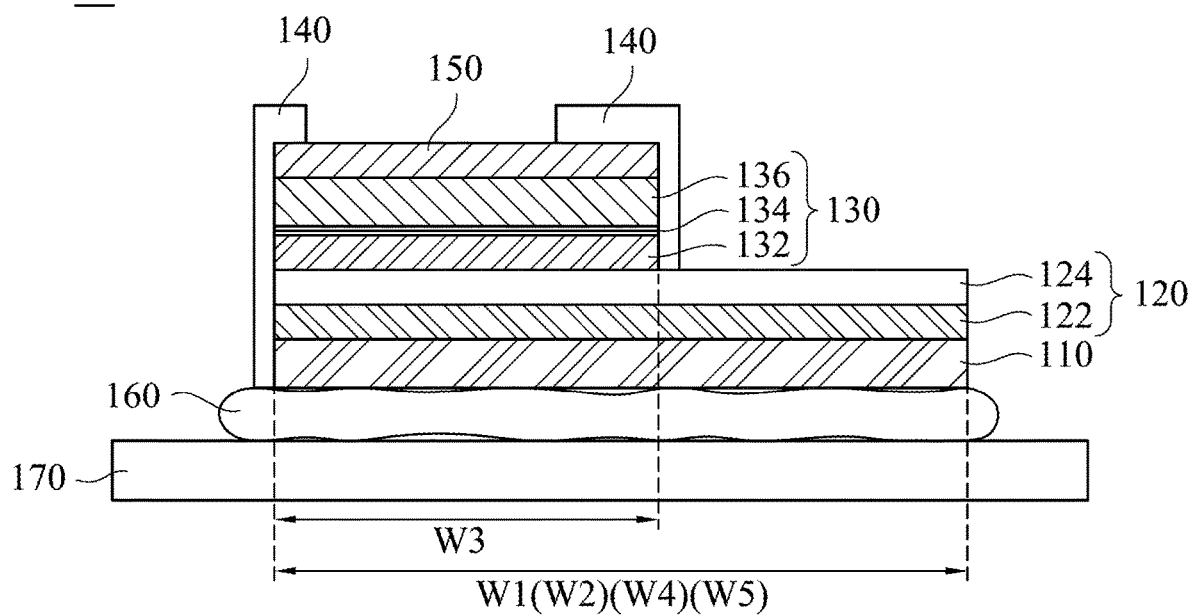
FIGS. 1A and 1B are cross-sectional views of the light emitting diode structure, in accordance with various embodiments of the present invention.
Figure 1B:
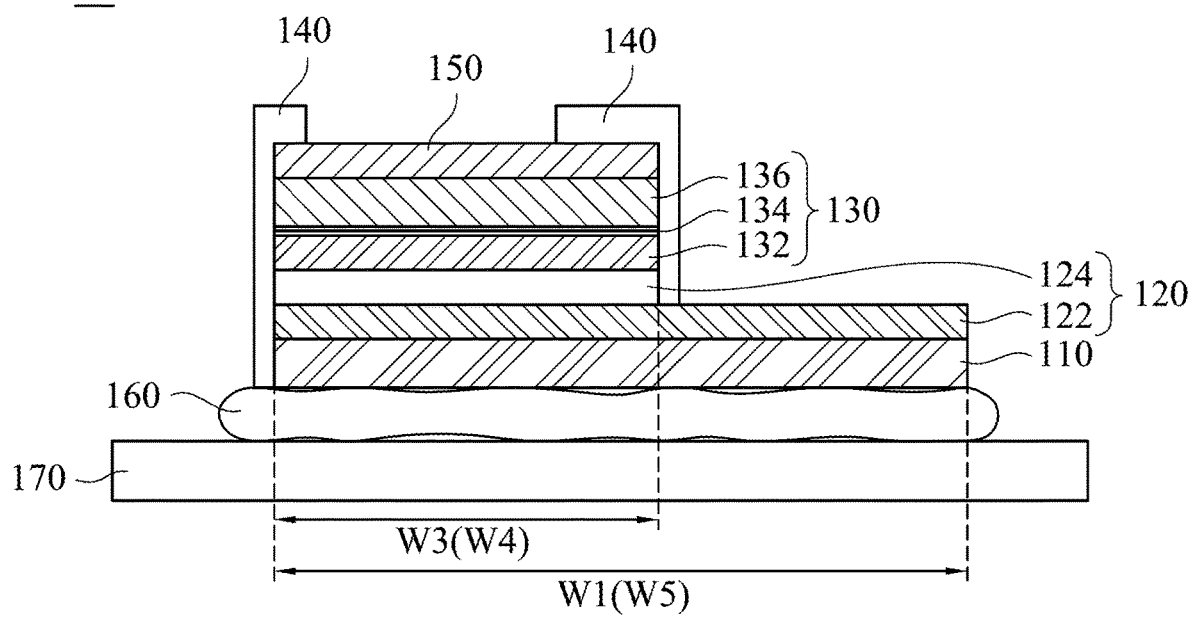

FIGS. 1A and 1B are cross-sectional views schematically illustrating a light emitting diode structure 10, in accordance with various embodiments of the present invention. Referring to FIG. 1A and FIG. 1B, the light emitting diode structure 10 disclosed herein includes a base layer 110, an electric contact layer 120, a semiconductor stack 130, and an insulation layer 140.

As shown in FIG. 1A and FIG. 1B, in particular, the base layer 110 has a maximum of a first width W1. More specifically, the base layer 110 may have a trapezoidal profile in a cross-sectional view in practical implementation. In various embodiments, the base layer 110 may include a dielectric material or a metal material. For example, the examples of dielectric material include silicon dioxide ($SiO_2$), silicon nitride ($Si_3N_4$), $TiO_2$, $Ta_2O_5$, or a combination thereof; the examples of the metal material include gold, aluminum, copper, or nickel.

As shown in FIG. 1A and FIG. 1B, the electric contact layer 120 has a maximum of a second width W2 and is disposed on the base layer 110. More specifically, the electric contact layer 120 may have a trapezoidal profile in a cross-sectional view in practical implementation. It is noted that the maximum of the second width W2 is smaller than or equal to the maximum of the first width W1. The semiconductor stack 130 has a maximum of a third width W3 and is disposed on the electric contact layer 120. The semiconductor stack 130 may have a trapezoidal profile in a cross-sectional view in practical implementation. More specifically, the semiconductor stack 130 includes a first type semiconductor layer 132, a light emitting layer 134, and a second type semiconductor layer 136 stacked in sequence on the electric contact layer 120. The first type semiconductor layer 132, the light emitting layer 134, and the second type semiconductor layer 136 may have respective trapezoidal profiles in a cross-sectional view in practical implementation. It can be understand that a width of the first type semiconductor layer 132, a width of the light emitting layer 134, and a width of the second type semiconductor layer 136 may be substantially smaller than or equal to the maximum of the third width W3. It is noted that the maximum of the second width W2 is greater than the maximum of the third width W3.

In various embodiments, the first type semiconductor layer 132 may be a P-type III-V group semiconductor layer. For example, the III-V group semiconductor layer may include a binary epitaxial material such as GaAs, GaN, GaP, InAs, AlN, InN, and InP, or a ternary or quaternary epitaxial material such as GaAsP, AlGaAs, InGaP, InGaN, AlInGaP, and InGaAsP. Therefore, the P-type III-V group semiconductor layer may be formed by doping a IIA group element (such as beryllium, magnesium, calcium, or strontium) into the III-V group semiconductor layer mentioned above.

In various embodiments, the light emitting layer 134 may include a multiple quantum well (MQW), a single-quantum well (SQW), a homojunction, a heterojunction, or other similar structures.

In various embodiments, the second type semiconductor layer 136 may be an N-type III-V group semiconductor layer. For example, the III-V group semiconductor layer may include a binary epitaxial material such as GaAs, GaN, GaP, InAs, AlN, InN, and InP, or a ternary or quaternary epitaxial material such as GaAsP, AlGaAs, InGaP, InGaN, AlInGaP, and InGaAsP. Therefore, the N-type III-V group semiconductor layer may be formed by doping a IVA group element (such as silicon) into the III-V group semiconductor layer mentioned above.

In the present embodiment, the electric contact layer 120 includes an ohmic contact layer 124 and a first metal layer 122 as shown in FIG. 1A and FIG. 1B. The ohmic contact layer 124 has a maximum of a fourth width W4 and is disposed between the semiconductor stack 130 and the base layer 110. The first metal layer 122 has a maximum of a fifth width W5 and is disposed between the ohmic contact layer 124 and the base layer 110. More specifically, the ohmic contact layer 124 and the first metal layer 122 may have respective trapezoidal profiles in a cross-sectional view in practical implementation. It is noted that the maximum of the fourth width W4 is smaller than or substantially equal to the maximum of the first width W1 and the maximum of the fifth width W5 is substantially equal to the maximum of the first width W1. In some embodiments, the ohmic contact layer 124 may include a light-transmitting conductive material or an opaque conductive material. For example, the light-transmitting conductive material may include indium tin oxide (ITO), IZO, AZO, or other materials with light-transmitting and conductive properties; and the opaque conductive material may include Ni, Ag, Ni/Au alloy or a combination thereof. In some embodiments, the first metal layer 122 includes Ti, Ni, Al, Au, Pt, Cr, Ag, Cu, or an alloy thereof. It is noted that when the ohmic contact layer 124 includes light-transmitting conductive material, the first metal layer 122 may reflect the light passing through the ohmic contact layer 124 back so that the light is directed upward, thereby increasing the light extraction efficiency.

In some embodiments, the electric contact layer 120 is a single layer. In particular, the single-layered electric contact layer 120 may include light-transmitting conductive material or opaque conductive material. For example, the light-transmitting conductive material may include indium tin oxide (ITO), IZO, AZO, or other materials with light-transmitting and conductive properties; and the opaque conductive material may include Ni, Ag, Ni/Au alloy or a combination thereof. In addition, no matter the electric contact layer 120 is a multi-layered or mono-layered structure, the electric contact layer 120 has a good electrical conductivity. Therefore, the interface resistance between the electric contact layer 120 and the first type semiconductor layer 132 may be reduced, thereby decreasing the driving voltage of the light emitting diode structure 10 and reducing the manufacturing difficulties of the electric contact layer 120 in the process.

Referring to FIG. 1A and FIG. 1B, the insulation layer 140 at least covers a sidewall of the base layer 110, a sidewall of the electric contact layer 120, and a sidewall of the semiconductor stack 130. In various embodiments, the materials of the insulation layer 140 may include silicon oxide, silicon nitride, silicon oxynitride, epoxy resins, or other suitable insulating materials.

In one embodiment, the light emitting diode structure 10 may further include an electrode layer 150 disposed on the semiconductor stack 130, and a portion of the electrode layer 150 is exposed outside the insulation layer 140, as shown in FIG. 1A and FIG. 1B. In one embodiment, the insulation layer 140 covers at least a sidewall of the electrode layer 150. In some embodiments, the insulation layer 140 may cover both the sidewall of the electrode layer 150 and a portion of a top surface of the electrode layer 150. In addition, in other embodiments, the insulation layer 140 covers only a portion of the upper surface of the semiconductor stack 130, thereby forming an opening. The remaining upper surface of the semiconductor stack 130 is exposed from the opening of the insulation layer 140. The electrode layer 150 may be disposed in the opening of the insulation layer 140 and contacts the semiconductor stack 130. Alternatively, the electrode layer 150 may further cover a portion of the top surface of the insulation layer 140. The portion of the electrode layer 150 exposed outside the insulation layer 140 acts as a stage for electrical contact.

In one embodiment, the electrode layer 150 is transparent for the light emitted by the light emitting layer 134. It is understood that the electrode layer 150 includes light-transmitting conductive material. For example, the light-transmitting conductive material may include indium tin oxide (ITO), IZO, AZO, or other materials with light-transmitting and conductive properties. In addition, since the light-transmitting conductive material mentioned above has a good electrical conductivity, the surface resistance of the second type semiconductor layer 136 may be reduced, thereby decreasing the driving voltage of the light emitting diode structure 10 and reducing the manufacturing difficulty of the electrode layer 150 in the process. In the embodiment where the electrode layer 150 includes light-transmitting conductive materials, the width of the electrode layer 150 is typically equal to the maximum of the third width W3 of the semiconductor stack 130 to make the manufacturing process become easier.

In another embodiment, the electrode layer 150 may also include opaque metal materials. For example, the electrode layer 150 is a second metal layer. For example, the opaque metal material may include Cr, GeAu, Au, Ti, Al, or other similar opaque metal materials. In the embodiment where the electrode layer 150 includes opaque metal material, in order not to affect the light emitting efficiency of the light emitting diode, the width of the electrode layer 150 is typically smaller than the maximum of the third width W3 of the semiconductor stack 130. For example, the width of the electrode layer 150 is as small as possible so long as it is sufficient to provide a contact area for the external wires.

In one embodiment, the light emitting diode structure 10 further includes a bonding substrate 170 as shown in FIG. 1A and FIG. 1B. In particular, the base layer 110, the electric contact layer 120, the semiconductor stack 130, and the insulation layer 140 are disposed on the bonding substrate 170. In some embodiments of the present invention, the bonding substrate 170 may be a rigid printed circuit board, an aluminum substrate with a high thermal conductivity coefficient, a ceramic substrate, a flexible printed circuit board, a metal-composite board, a light emitting substrate, or a semiconductor substrate with functional elements such as transistors and integrated circuits (ICs). In one embodiment, the light emitting diode structure 10 may further include an adhesive layer 160 disposed between the bonding substrate 170 and the base layer 110 to improve the bonding strength there between. In some embodiments of the present invention, the adhesive layer 160 may include insulating glue, conductive glue and/or suitable metals. For example, the material of the adhesive layer 160 may be an insulating glue such as epoxy resin or silicone; alternatively the material of the adhesive layer 160 may be a conductive glue such as an epoxy resin mixed with silver powders. Furthermore, the material of the adhesive layer 160 may be a metallic material such as copper, aluminum, tin, gold, indium and/or silver, but not limited thereto.

The various embodiments of FIG. 1A and FIG. 1B will be described hereinafter, and the following description merely describes the differences between these embodiments, and the repeated portions will not be described again. Referring to FIG. 1A, the electric contact layer 120 of the light emitting diode structure 10 includes the ohmic contact layer 124 and the first metal layer 122, and the first metal layer 122 is disposed between the ohmic contact layer 124 and the base layer 110 in this embodiment. The first type semiconductor layer 132 and the second type semiconductor layer 136 in the semiconductor stack 130 are respectively a P-type and an N-type III-V group semiconductor layer (such as including GaN). The electrode layer 150 disposed on the semiconductor stack 130 includes a light-transmitting conductive material (such as ITO). In this embodiment, the maximum of the first width W1 of the base layer 110 is substantially equal to the maximum of the second width W2 of the electric contact layer 120, wherein the maximum of the fourth width W4 of the ohmic contact layer 124 is substantially equal to the maximum of the fifth width W5 of the first metal layer 122, and the maximum of the second width W2 of the electric contact layer 120 is greater than the maximum of the third width W3 of the semiconductor stack 130.

Referring to FIG. 1B, the difference between the light emitting diode structure 10 illustrated in FIG. 1B and the light emitting diode structure 10 illustrated in FIG. 1A is that: the maximum of the first width W1 of the base layer 110 is substantially equal to the maximum of the fifth width W5 of the first metal layer 122, the maximum of the third width W3 of the semiconductor stack 130 is substantially equal to the maximum of the fourth width W4 of the ohmic contact layer 124, and the maximum of the fifth width W5 of the first metal layer 122 is greater than the maximum of the third width W3 of the semiconductor stack 130.

Figure 2:
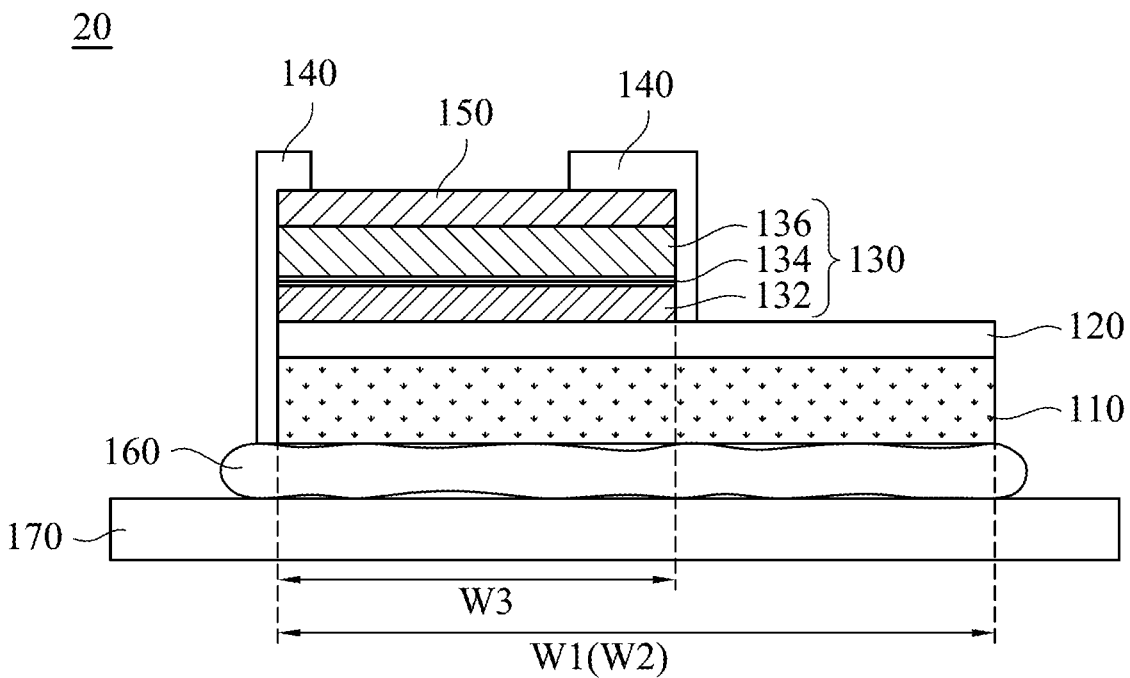
FIG. 2 is cross-sectional view of the light emitting diode structure, in accordance with another embodiment of the present invention.

FIG. 2 is cross-sectional view schematically illustrating a light emitting diode structure, in accordance with another embodiment of the present invention. To make it easy to compare the differences between the embodiments in FIGS. 1A-1B and the embodiments in FIG. 2, and in order to simplify the descriptions, the same symbols are used to label the same members in the following various embodiments and mainly the differences between the various embodiments are described while repetitive parts are not described again.

The difference between the light emitting diode structure 20 illustrated in FIG. 2 and the light emitting diode structure 10 illustrated in FIG. 1A is that: the base layer 110 of the light emitting diode structure 20 includes a distributed bragg reflector (DBR). The electric contact layer 120 is a single layer including light-transmitting conductive material. For example, the light-transmitting conductive material may include indium tin oxide (ITO), IZO, AZO, or other materials with light-transmitting and conductive properties. Since the light-transmitting conductive materials mentioned above has a good electrical conductivity, the surface resistance of the first type semiconductor layer 132 may be reduced, thereby decreasing the driving voltage of the light emitting diode structure 20 and reducing the manufacturing difficulty of the electric contact layer 120 in the process. The electric contact layer 120 has a maximum of a second width W2. In particular, the distributed bragg reflector may be comprised of two kinds of thin films (homogeneous or heterogeneous) with different refractive indices alternatively stacked with each other. The distributed bragg reflector may reflect the light emitted from the light emitting layer 134 in the semiconductor stack 130 and directs the light in a direction away from the bonding substrate 170 to improve the luminous efficiency of the light emitting diode structure 20. It is noted that the maximum of the second width W2 is greater than the maximum of the third width W3.

Figure 3:
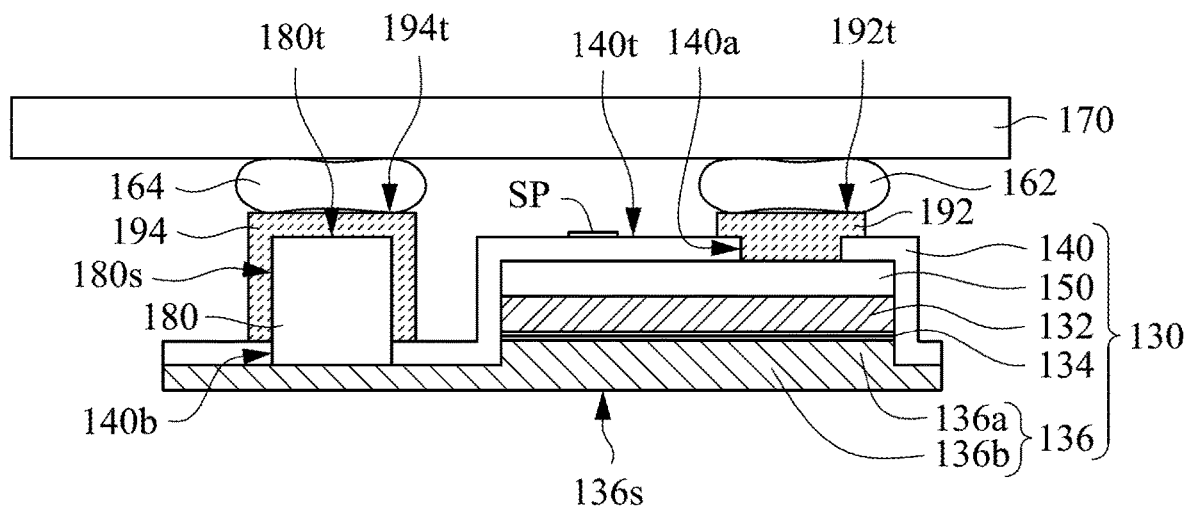
FIG. 3 is cross-sectional view of the light emitting diode structure, in accordance with yet another embodiment of the present invention.

FIG. 3 is cross-sectional view schematically a light emitting diode structure, in accordance with yet another embodiment of the present invention. To make it easy to compare the differences between various embodiments and in order to simplify the descriptions, the same symbols are used to label the same members in the following various embodiments and mainly the differences between the various embodiments are described while repetitive parts are not described again.

As shown in FIG. 3, the light emitting diode structure 30 includes a semiconductor stack 130, an insulation layer 140, a first conductive pad 192, a second conductive pad 194, and a supporting breakpoint SP. In particular, the semiconductor stack 130 includes a first type semiconductor layer 132, a light emitting layer 134, and a second type semiconductor layer 136 stacked in sequence from top to bottom. The second type semiconductor layer 136 includes a first portion 136a and a second portion 136b, and the first portion 136a is disposed on the second portion 136b. In one embodiment, a width of the first type semiconductor layer 132, a width of the light emitting layer 134, and a width of the first portion 136a of the second type semiconductor layer 136 may be the same. It noted that a width of the second portion 136b of the second type semiconductor layer 136 is greater than the width of the first portion 136a. In other words, the second type semiconductor layer 136 has a trapezoidal profile in a cross-sectional view. The insulation layer 140 covers a sidewall of the semiconductor stack 130 and an upper surface of the second portion 136b. It is noted that the insulation layer 140 has a first opening 140a and a second opening 140b respectively positioned on the first type semiconductor layer 132 and the second portion 136b of the second type semiconductor layer 136. The first conductive pad 192 is connected to the first type semiconductor layer 132 through the first opening 140a, and the second conductive pad 194 is connected to the second portion 136b of the second type semiconductor layer 136 through the second opening 140b. In some embodiments, the first conductive pad 192 extends to cover a portion of a top surface 140t of the insulation layer 140. In one embodiment, a top surface 192t of the first conductive pad 192 is substantially level with a top surface 194t of the second conductive pad 194. The supporting breakpoint SP is positioned on the insulation layer 140 and between the first conductive pad 192 and the second conductive pad 194.

Referring to FIG. 3, in one embodiment, the light emitting diode structure 30 further includes an electrode layer 150 disposed between the first type semiconductor layer 132 and the first conductive pad 192. In one embodiment, the light emitting diode structure 30 further includes a bonding substrate 170. The first conductive pad 192 and the second conductive pad 194 of the light emitting diode structure 30 are electrically connected to the bonding substrate 170. Namely, the first conductive pad 192 and the second conductive pad 194 of the light emitting diode structure 30 are electrically connected to the bonding substrate 170 in a manner of "flip-chip". In some embodiments, the light emitting diode structure 30 may further include a first adhesive layer 162 and a second adhesive layer 164. More specifically, the first adhesive layer 162 is disposed between the first conductive pad 192 and the bonding substrate 170, and the second adhesive layer 164 is disposed between the second conductive pad 194 and the bonding substrate 170. It is noted that the first adhesive layer 162 is electrically insulated from the second adhesive layer 164 to avoid a short circuit between the first conductive pad 192 and the second conductive pad 194. In various examples, the first adhesive layer 162 and the second adhesive layer 164 are transparent conductive adhesive layers. For example, the transparent conductive adhesive layer includes epoxy resins mixed with silver powders or anisotropic conductive films (ACFs).

Referring to FIG. 3, in some embodiments, the light emitting diode structure 30 further includes a conductive block 180. The conductive block 180 is disposed in the second opening 140b, and the second conductive pad 194 covers a top surface 180t and a sidewall 180s of the conductive block 180. In one embodiment, a top surface 140t of the insulation layer 140 over the electrode layer 150 is substantially level with the top surface 180t of the conductive block 180.

Another aspect of the present invention is to provide a method for manufacturing a light emitting diode structure 10. FIG. 4 to FIG. 16B are cross-sectional views illustrating various process stages of manufacturing the light emitting diode structure 10, in accordance with one embodiment of the present invention.

Figure 4:
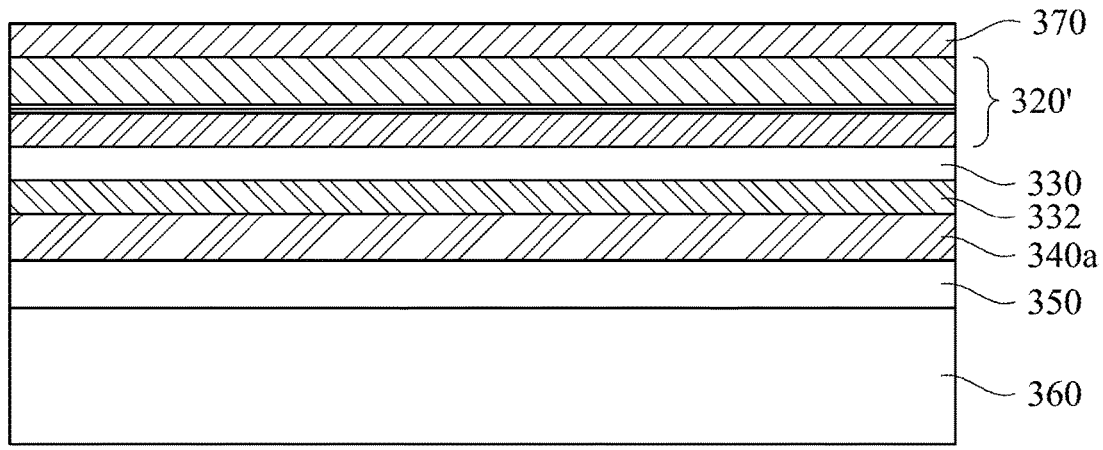
FIG. 4 to FIG. 11B are cross-sectional views illustrating various process stages of manufacturing the light emitting diode structure, in accordance with one embodiment of the present invention.

As shown in FIG. 4, a precursor structure 40 is provided. The precursor structure 40 includes an electrode layer 370, a semiconductor stack 320', an ohmic contact layer 330, a metal layer 332, a base layer 340a, and a sacrificial layer 350 stacked in sequence on a carrier substrate 360 from top to bottom.

Figure 5:
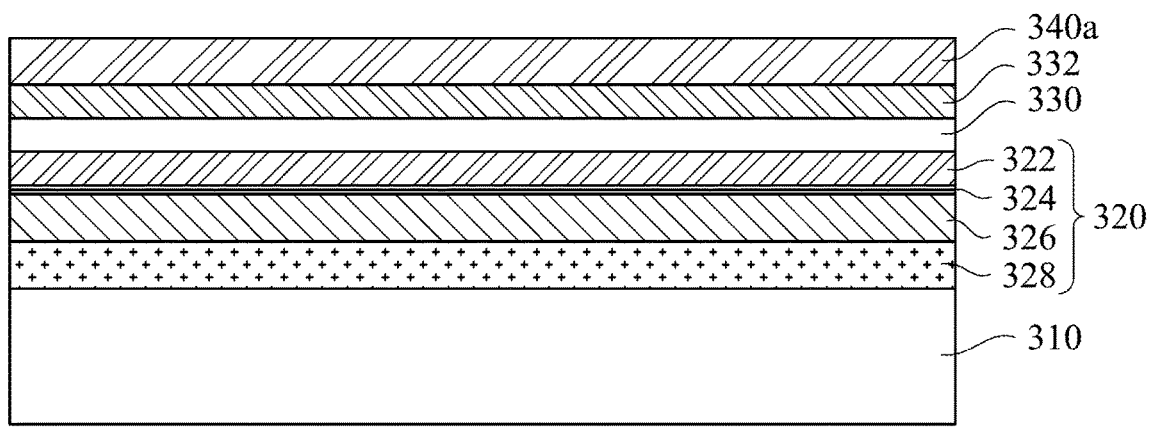

FIG. 5 to FIG. 9 are cross-sectional views illustrating various process stages of manufacturing the precursor structure mention above, in accordance with one embodiment of the present invention. Referring to FIG. 5, an epitaxial stack 320 is formed on a growth substrate 310. In one embodiment, the epitaxial stack 320 may be formed on the growth substrate 310 by epitaxial growth techniques. In one embodiment, the growth substrate 310 may be a sapphire substrate or other suitable substrates. In various embodiments, the epitaxial stack 320 includes an undoped semiconductor layer 328, a second type semiconductor layer 326, a light emitting layer 324, and a first type semiconductor layer 322 stacked on the growth substrate 310 in sequence. In some embodiments, the undoped semiconductor layer 328 is an undoped III-V group semiconductor layer. For example, the undoped III-V group semiconductor layer may include binary an epitaxial material such as GaAs, GaN, GaP, InAs, AlN, InN, and InP, or ternary or quaternary epitaxial materials such as GaAsP, AlGaAs, InGaP, InGaN, AlInGaP, and InGaAsP. In some embodiments, the second type semiconductor layer 326 is an N-type III-V group semiconductor layer and the first type semiconductor layer 322 is a P-type III-V group semiconductor layer. It should be understood that the N-type III-V group semiconductor layer may be formed by doping an IVA group element (such as silicon) into the undoped III-V group semiconductor layer mentioned above and the P-type III-V group semiconductor layer may be formed by doping an IIA group element (such as beryllium, magnesium, calcium, or strontium) into the undoped III-V group semiconductor layer mentioned above. In various embodiments, the light emitting layer 324 may include a multiple quantum well (MQW), a single-quantum well (SQW), a homojunction, a heterojunction, or other similar structures.

Referring to FIG. 5, an ohmic contact layer 330, a metal layer 332, and a base layer 340a are formed and stacked on the epitaxial stack 320 in sequence from bottom to top. In the present embodiment, the ohmic contact layer 330 may include light-transmitting conductive materials or opaque conductive materials. For example, the light-transmitting conductive material may include indium tin oxide (ITO), IZO, AZO, or materials with light-transmitting and conductive properties; and the opaque conductive material may include Ni, Ag, Ni/Au alloy, or a combination thereof. The material of the metal layer 332 may be the same as the first metal layer 122 described hererinbefore, and will not be described hereinafter. In the present embodiment, the base layer 340a may include a dielectric material or a metal material. For example, the dielectric material may include silicon dioxide ($SiO_2$), silicon nitride ($Si_3N_4$), $TiO_2$, $Ta_2O_5$, or a combination thereof; and the metal material may include gold, aluminum, copper, or nickel.

Figure 6:
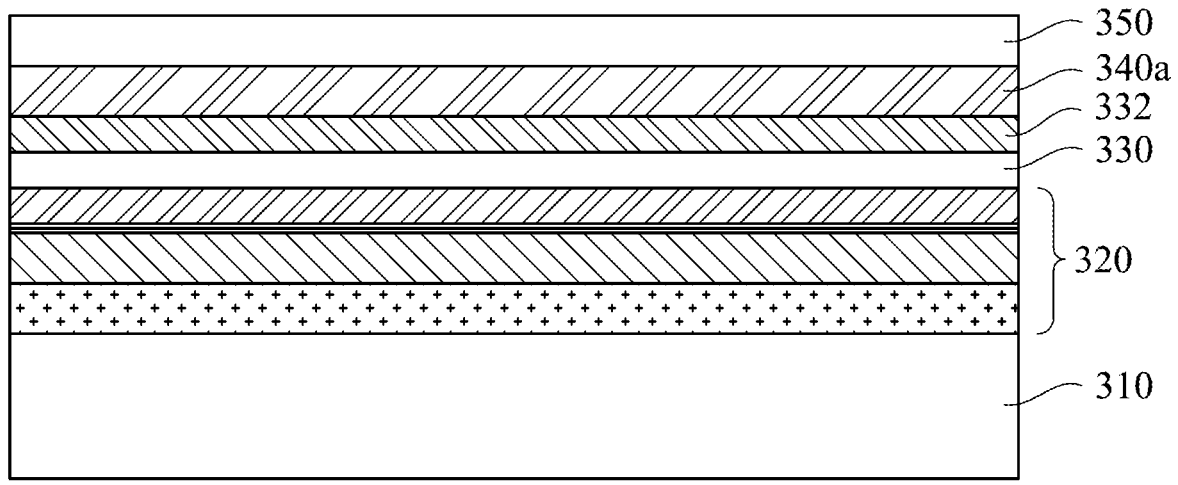

Referring to FIG. 6, a sacrificial layer 350 is formed on the base layer 340a. In various embodiments, the sacrificial layer 350 includes benzocyclobutene (BCB) or polyimide (PI).

Figure 7:
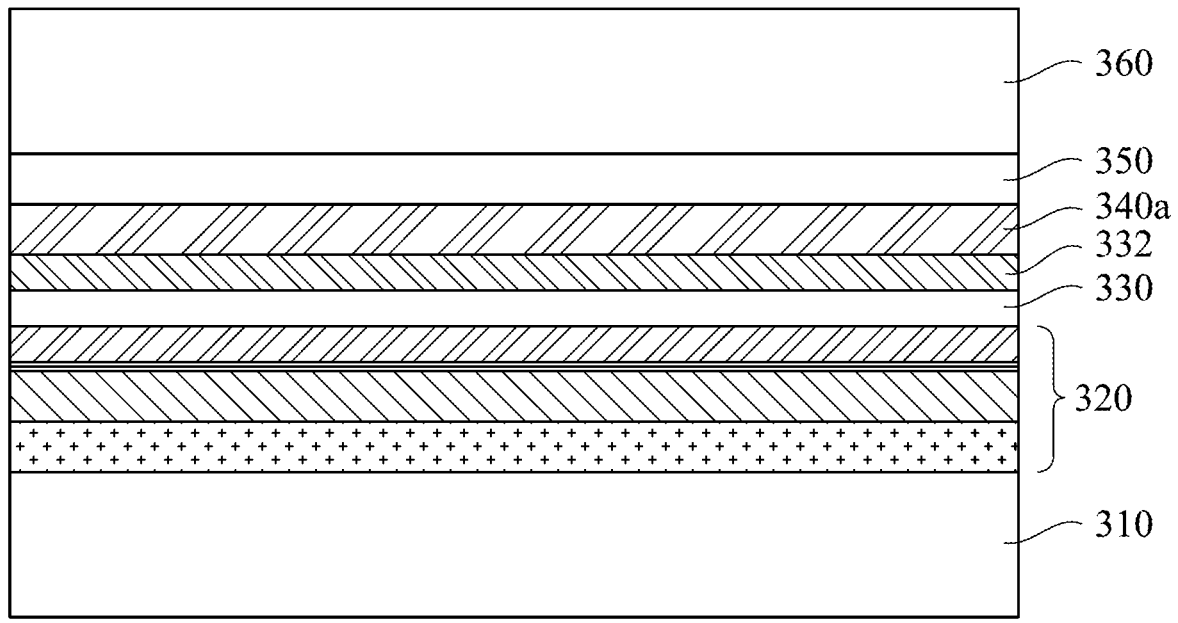

Referring to FIG. 7, a carrier substrate 360 is then formed on the sacrificial layer 350. In various embodiments, the carrier substrate 360 may be a silicon substrate or other suitable substrates. It should be stated that after forming the sacrificial layer 350 on the carrier substrate 360, the structure as shown in FIG. 7 is flipped upside down so that the growth substrate 310 is at the top and the carrier substrate 360 is at the bottom.

Figure 8:
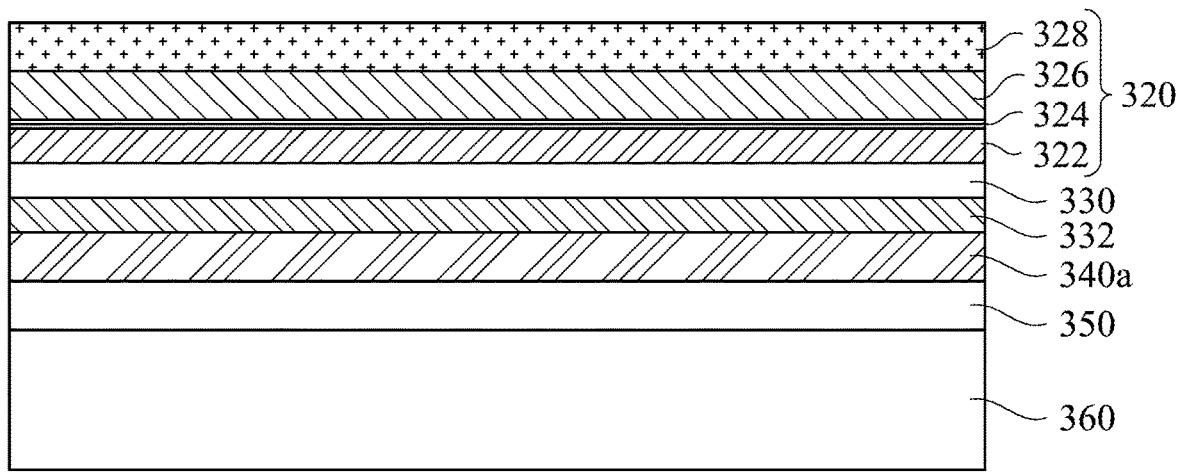

Referring to FIG. 8, the growth substrate 310 is removed. In some embodiments, the growth substrate 310 may be removed by laser lift-off (LLO), grinding, or etching. In particular, the growth substrate 310 is removed to expose the undoped semiconductor layer 328 of the epitaxial stack 320.

Figure 9:
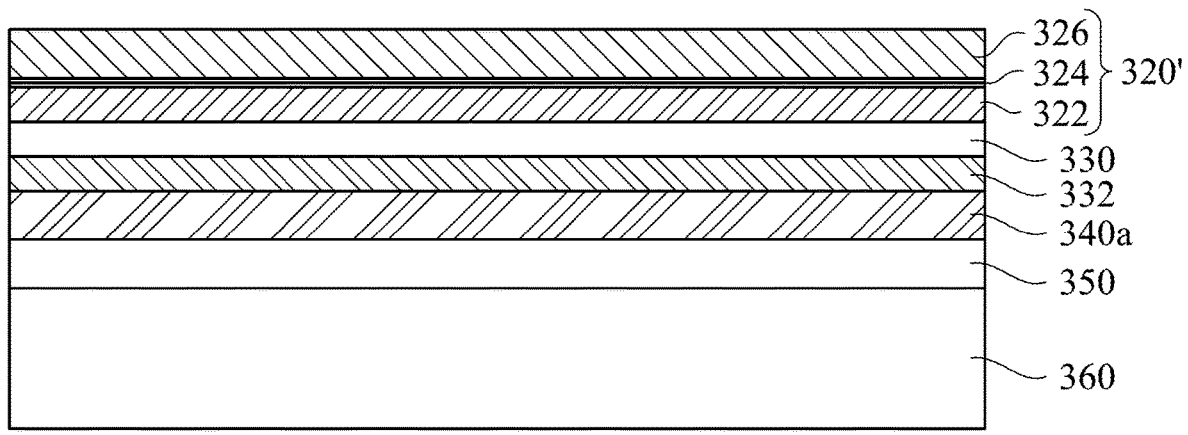

Referring to FIG. 9, subsequently, a portion of the epitaxial stack 320 is removed to form a semiconductor stack 320'. More specifically, the undoped semiconductor layer 328 of the epitaxial stack 320 does not have a conductive function, so the undoped semiconductor layer 328 of the epitaxial stack 320 is completely removed in this step and the second type semiconductor layer 326 is exposed. After this step, the semiconductor stack 320' (that is the remaining epitaxial stack) includes the second type semiconductor layer 326, the light emitting layer 324, and the first type semiconductor layer 322 stacked on the ohmic contact layer 330 from top to bottom in sequence.

Then, the electrode layer 370 is formed on the semiconductor stack 320' to complete the precursor structure 40 as shown in FIG. 4. In one embodiment, the electrode layer 370 includes light-transmitting conductive materials. For example, the light-transmitting conductive material may include indium tin oxide (ITO), IZO, AZO, or materials with light-transmitting and conductive properties. In addition, since the light-transmitting conductive materials mentioned above has a good electrical conductivity, the surface resistance of the second type semiconductor layer 326 may be reduced, thereby decreasing the driving voltage of the light emitting diode and reducing the difficulty in the process of manufacturing the electrode layer 370. In another embodiment, the electrode layer 370 may also include opaque metal materials. For example, the opaque metal material may include Cr, GeAu, Au, Ti, Al, or other similar opaque metal materials.

Figure 10A:
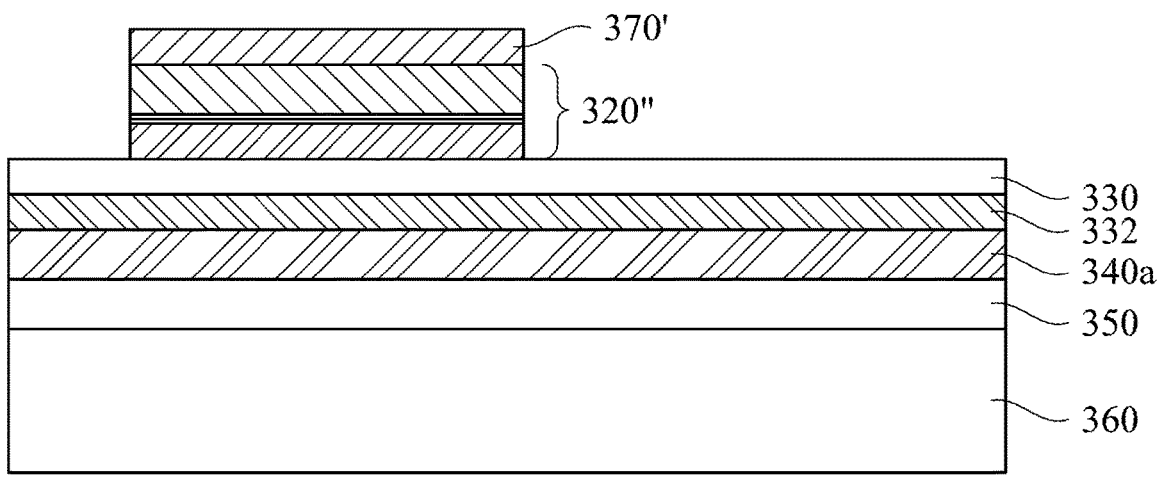
Figure 10B:
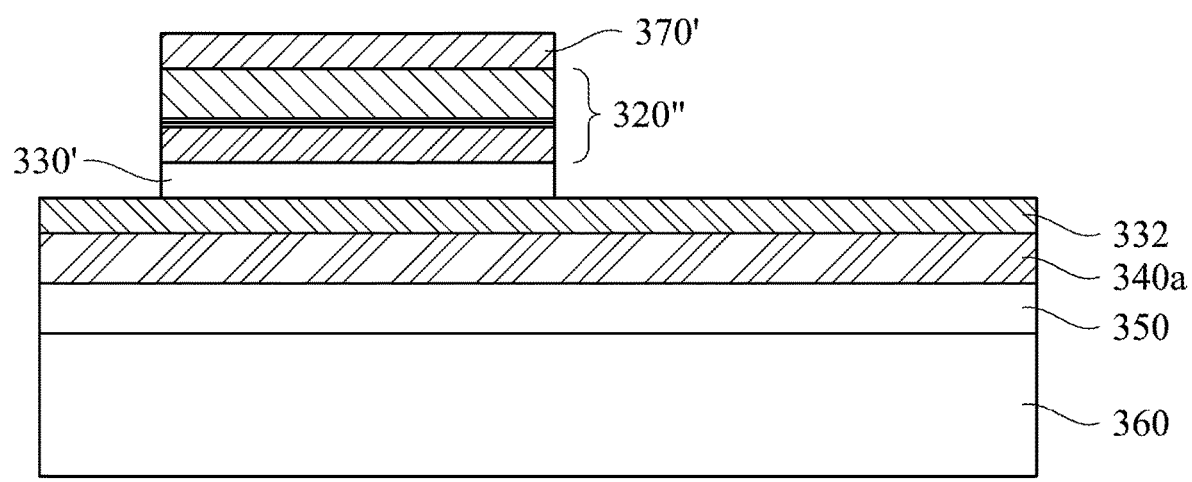

Next, a portion of the electrode layer 370, a portion of the semiconductor stack 320', a portion of the ohmic contact layer 330, a portion of the metal layer 332, and a portion of the base layer 340a in the precursor structure 40 are removed to expose the sacrificial layer 350. FIG. 10A to FIG. 11B are cross-sectional views illustrating this step according to one embodiment of the present invention. There are two removal processes included in this step. As shown in FIG. 10A, in one embodiment, the first removal process may utilize a lithography process to remove the portion of the electrode layer 370 and the portion of the semiconductor stack 320' so to expose the ohmic contact layer 330. In this embodiment, the remaining semiconductor stack 320" and the remaining electrode layer 370' have the same width. As shown in FIG. 10B, in another embodiment, the first removal process may utilize a lithography process to remove a portion of the electrode layer 370, a portion of the semiconductor stack 320', and a portion of the ohmic contact layer 330 so to expose the metal layer 332. In the embodiment, the remaining semiconductor stack 320", the remaining electrode layer 370', and the remaining ohmic contact layer 330' have the same width. It should be noted that, in the embodiment where the electrode layer 370 includes light-transmitting conductive materials, the width of the remaining semiconductor stack 320" after etching is substantially equal to the width of the remaining electrode layer 370'. In the embodiment where the electrode layer 370 includes opaque metal materials, in order not to affect the light extraction efficiency of the light emitting diode, the width of the remaining electrode layer 370' after etching is usually smaller than the width of the remaining semiconductor stack 320". For example, the width of the remaining electrode layer 370' is as small as possible so long as it is sufficient to provide a contact area for the external wires.

Figure 11A:
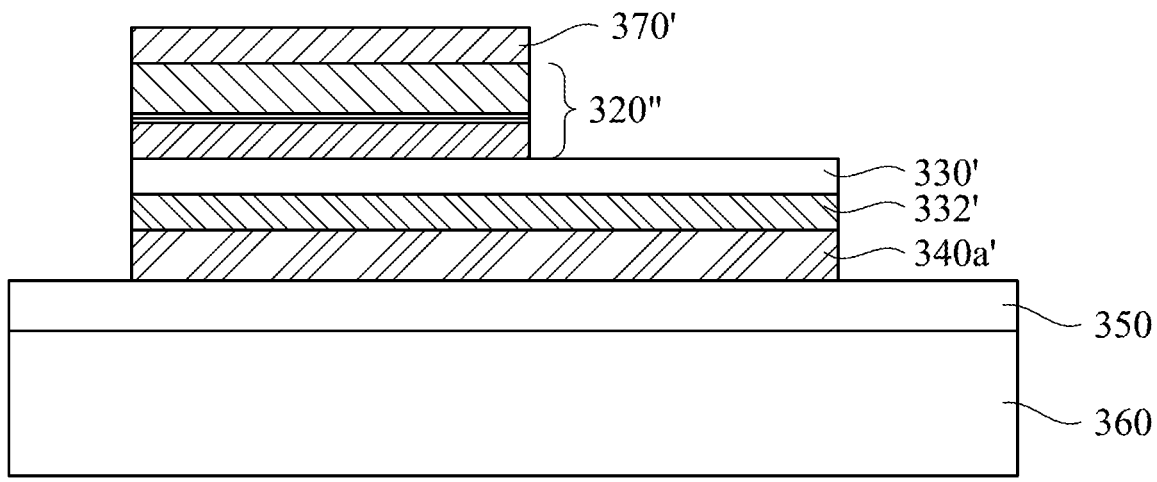
Figure 11B:
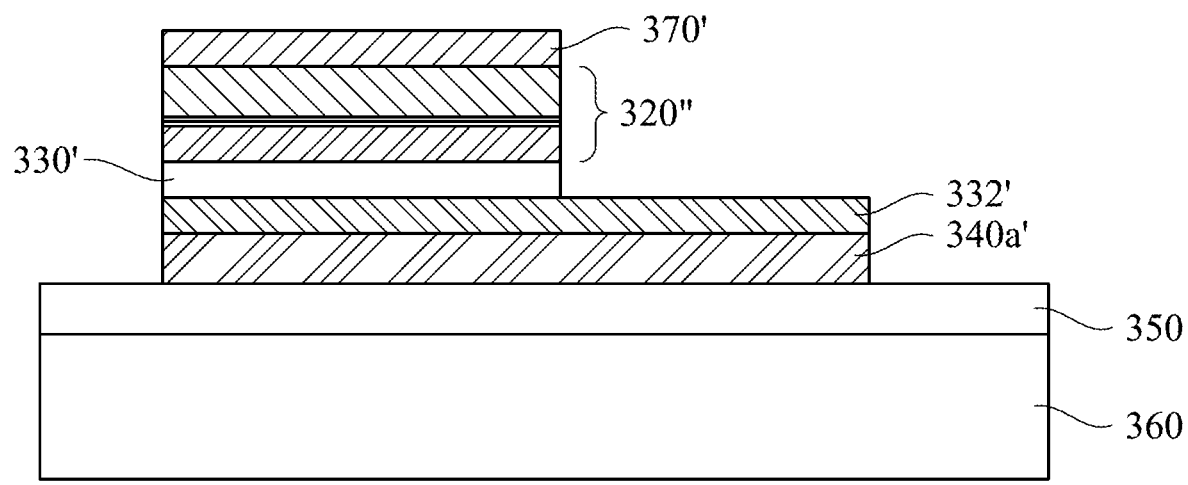

As shown in FIG. 11A, in one embodiment, the second removal process may utilize a lithography process to remove a portion of the ohmic contact layer 330, a portion of the metal layer 332, and a portion of the base layer 340a so to expose the sacrificial layer 350. In this embodiment, the remaining ohmic contact layer 330', the remaining metal layer 332', and the remaining base layer 340a' have substantially the same width, and the width of the remaining ohmic contact layer 330' is greater than the width of the remaining semiconductor stack 320". As shown in FIG. 11B, in another embodiment, the second removal process may utilize a lithography process to remove a portion of the metal layer 332 and a portion of the base layer 340a so to expose the sacrificial layer 350. In this embodiment, the remaining metal layer 332' and the remaining base layer 340a' substantially have the same width, and the width of the remaining metal layer 332' is greater than the width of the remaining semiconductor stack 320".

Figure 12:
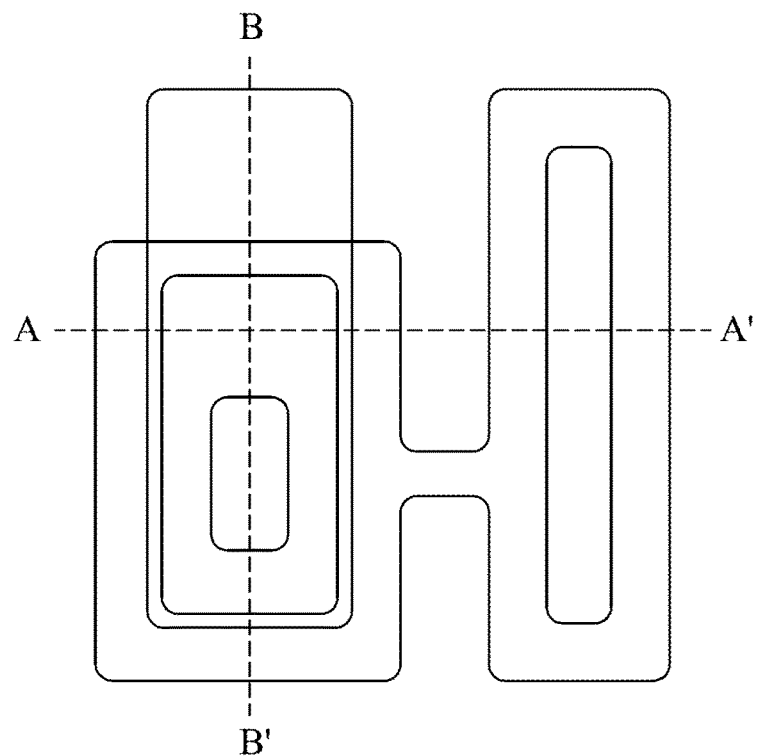
FIG. 12 is top view illustrating one process stage of manufacturing the light emitting diode structure, in accordance with one embodiment of the present invention.
Figure 13:
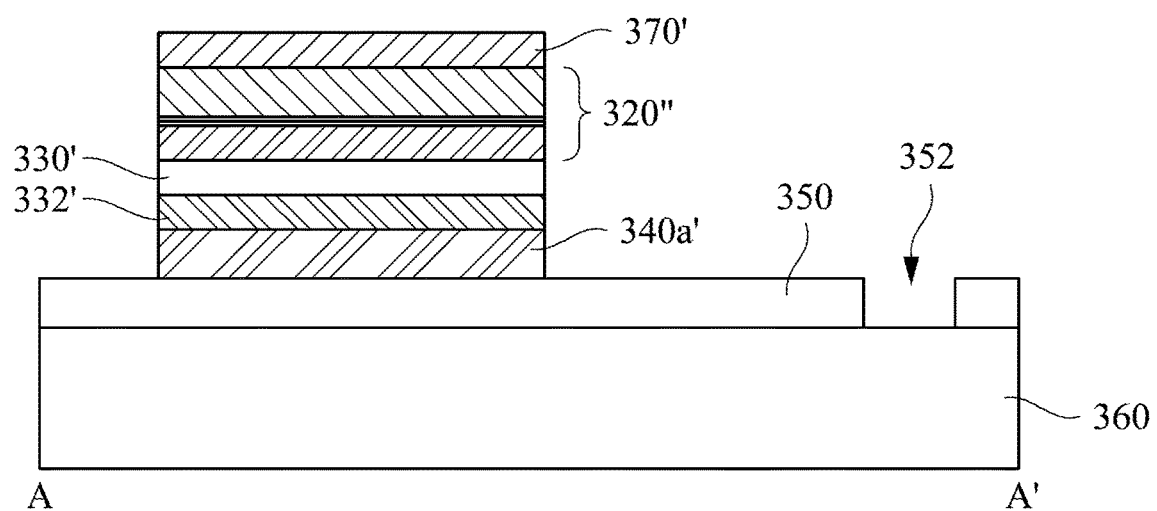
FIG. 13 to FIG. 15 are cross-sectional views illustrating various process stages of manufacturing the light emitting diode structure, in accordance with the line A-A' in FIG. 12.
Figure 14:
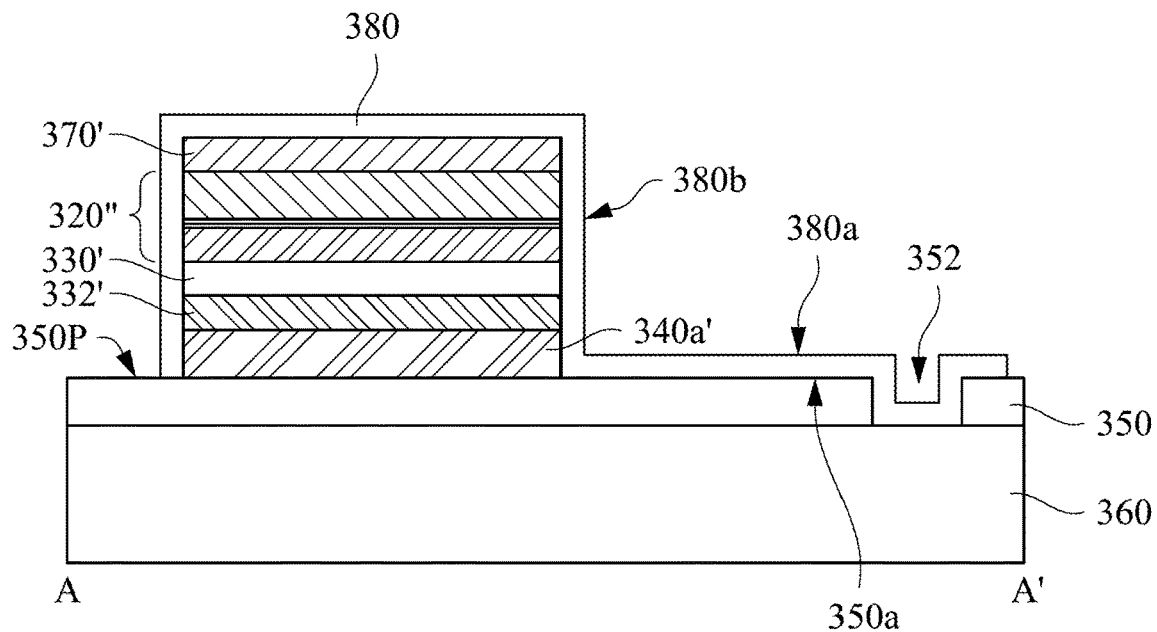
Figure 15:
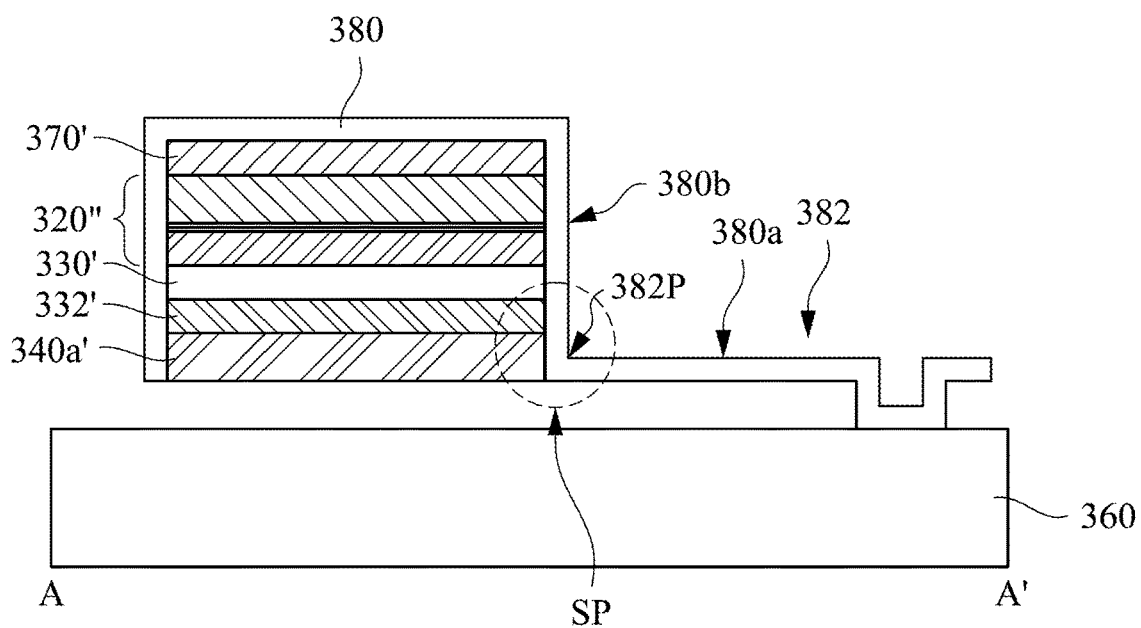
Figure 16A:
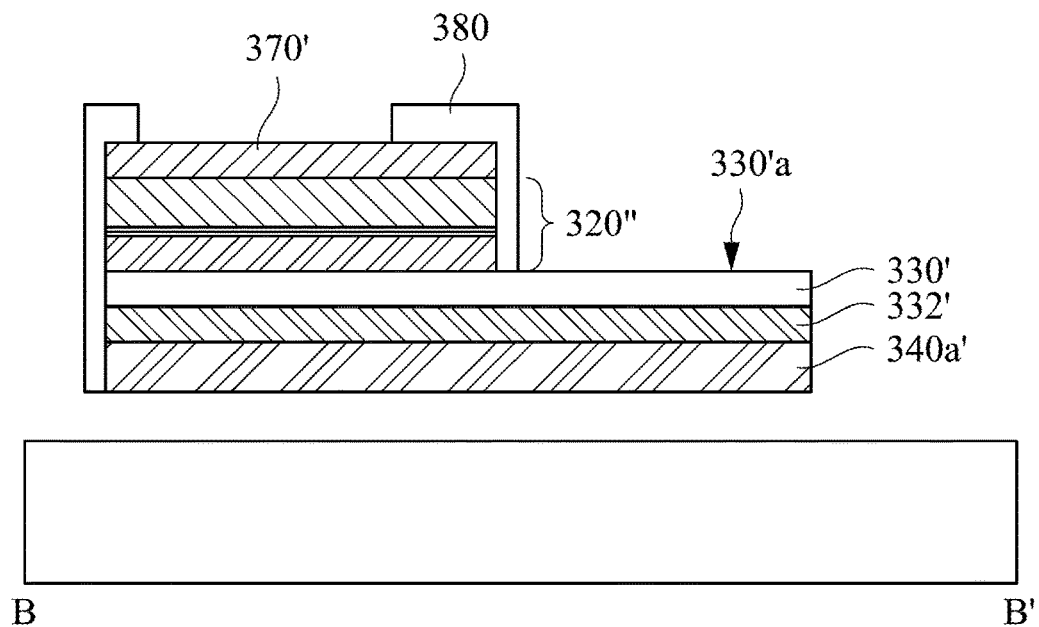
FIG. 16A to FIG. 16B are cross-sectional views illustrating one process stage of manufacturing the light emitting diode structure, in accordance with the line B-B' in FIG. 12.
Figure 16B:
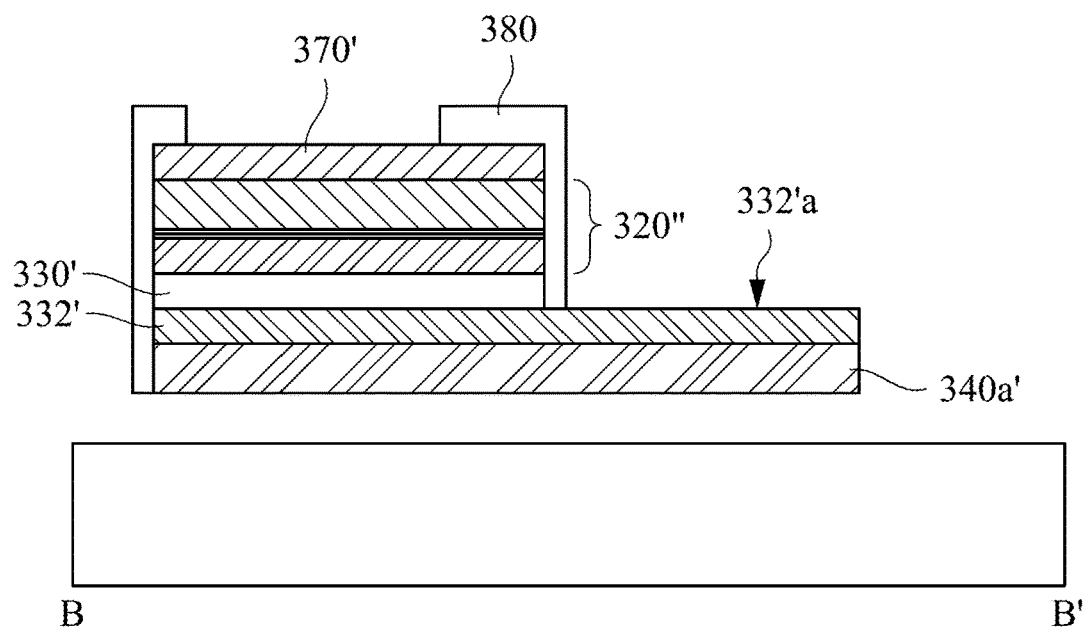

FIG. 12 illustrates a top view in one process stage of manufacturing the light emitting diode structure. FIG. 13 to FIG. 15 are cross-sectional views along line A-A' in FIG. 12, that illustrate various process stages in accordance with some embodiments. FIG. 16A to FIG. 16B are cross-sectional views along line B-B' in FIG. 12 illustrating one of process stages of manufacturing the light emitting diode structure. It should be noted that in FIG. 13 to FIG. 15, due to the position of the cutting line A-A', the remaining base layer 340a', the remaining metal layer 332', the remaining ohmic contact layer 330', the remaining semiconductor stack 320", and the remaining electrode layer 370' have the same width.

Referring to FIG. 13 and FIG. 14, an opening 352 is formed in the sacrificial layer 350 to expose a portion of the carrier substrate 360. Specifically, the opening 352 is adjacent to the remaining multilayered structure (including 340a', 332', 330', 320", and 370') after the etching process. It should be noted that the opening 352 is not a part of the light emitting diode structure.

Next, referring to FIG. 14, an insulation layer 380 is formed to continuously cover the remaining base layer 340a', the remaining metal layer 332', the remaining ohmic contact layer 330', the remaining semiconductor stack 320", the remaining electrode layer 370', a portion 350a of a top surface of the sacrificial layer 350, the opening 352, and the exposed portion of the carrier substrate 360. In particular, the insulation layer 380 has a first portion 380a covering the portion 350a of the top surface of the sacrificial layer 350, and the insulation layer 380 has a second portion 380b coupling to the first portion 380a and covering a sidewall of the remaining multilayered structure (including 340a', 332', 330', 320", and 370'). The first portion 380a and the second portion 380b of the insulation layer 380 constitute an "L" type. A portion of the sacrificial layer 350 uncovered by the insulation layer 380 (that is the exposed portion 350P) and the portion 350a, which is covered by the first portion 380a of the insulation layer 380, of the top surface of the sacrificial layer 350 are located on opposite sides of the remaining multilayer structure (including 340a', 332', 330', 320", and 370'). In some embodiments of the present invention, the materials of the insulation layer 380 are the same as these described hereinbefore in connection with the insulation layer 140, and will not be described herein. In some embodiments of the present invention, the insulation layer 380 may be formed by using chemical vapor deposition, printing, coating, or other suitable methods. In particular, the insulation layer 380 has a thickness ranged from about 500 Å to about 20000 Å. According to various embodiments, when the thickness of the insulation layer 380 is greater than a certain value such as 20000 Å, it will lead to an increase in the manufacturing cost. To the contrary, when the thickness of the insulation layer 380 is less than a certain value such as 500 Å, it will cause the lack of support force in the following processes. Therefore, the thickness of the insulation layer 380 may be such as 600 Å, 700 Å, 800 Å, 900 Å, 1000 Å, 2000 Å, 3000 Å, 4000 Å, 5000 Å, 6000 Å, 7000 Å, 8000 Å, 9000 Å, 10000 Å, or 15000 Å.

Referring to FIG. 15, FIG. 16A, and FIG. 16B, the sacrificial layer 350 is removed. More specifically, the sacrificial layer 350 may be removed from the exposed portion 350P of the sacrificial layer by using an etching solution. As shown in FIG. 15, after the sacrificial layer 350 is etched, a portion of the insulation layer 380 may constitute a supporter 382. The remaining electrode layer 370', the remaining semiconductor stack 320", the remaining ohmic contact layer 330', the remaining metal layer 332', and the remaining base layer 340a' are suspended over the carrier substrate 360 by the supporter 382. Since only the supporter 382 is left to support the upper structure after removing the sacrificial layer 350, it is easy to break the supporter 382. In addition, only a portion of the sacrificial layer 350 is necessary to be removed in some embodiments. For example, merely a portion of the sacrificial layer 350 is removed from the upper surface of the sacrificial layer 350 such that the remaining electrode layer 370', the remaining semiconductor stack 320", the remaining ohmic contact layer 330', the remaining metal layer 332', and the remaining base layer 340a' are suspended over the carrier substrate 360. That is to say, it is not necessary to completely remove the sacrificial layer 350 as long as the supporter 382 can be broken. In FIG. 16A and FIG. 16B, the insulation layer 380 covers at least a sidewall of the remaining base layer 340a', a sidewall of the remaining metal layer 332', a sidewall of the remaining ohmic contact layer 330', a sidewall of the remaining semiconductor stack 320", and a sidewall of the remaining electrode layer 370'. Further, a portion 330'a of the top surface of the remaining ohmic contact layer 330' or a portion 332'a of the top surface of the remaining metal layer 332' is exposed. In some embodiments, the insulation layer 380 may also cover a portion of the top surface of the remaining electrode layer 370'.

Please referring back to FIG. 15, the supporter 382 of the insulation layer 380 is then intentionally to be broken, thereby forming an individual light emitting diode structure. It should be noted that after the operation of breaking the supporter 382, a supporting breakpoint SP would be formed in each individual light emitting diode structure. More specifically, the supporting breakpoint SP may include the supporter 382 broken at a transition position 382P of the first portion 380a and the second portion 380b, the supporter 382 broken at any position of the first portion 380a, or a sidewall on which a portion of the second portion 380b is detached from the remaining multilayer structure (340a', 332', 330', 320", or 370'). In some embodiments, the individual light emitting diode structure may be disposed on the bonding substrate 170 so to form the light emitting diode structure 10 as shown in FIG. 1A and FIG. 1B. In addition, the adhesive layer 160 may be formed on the bonding substrate 170 first, and then the individual light emitting diode structure may be disposed on the adhesive layer 160 to enhance the adhesion there between. The various features of the micro light emitting diode structure 10 as shown in FIG. 1A and FIG. 1B have been described hereinbefore, and the details are not repeated herein. It is noted that the processes or operations described above are illustrated for examples only, and each operation can be arbitrarily changed according to the requirements. In some embodiments, additional operations can be performed before, during or after the process above.

Figure 17:
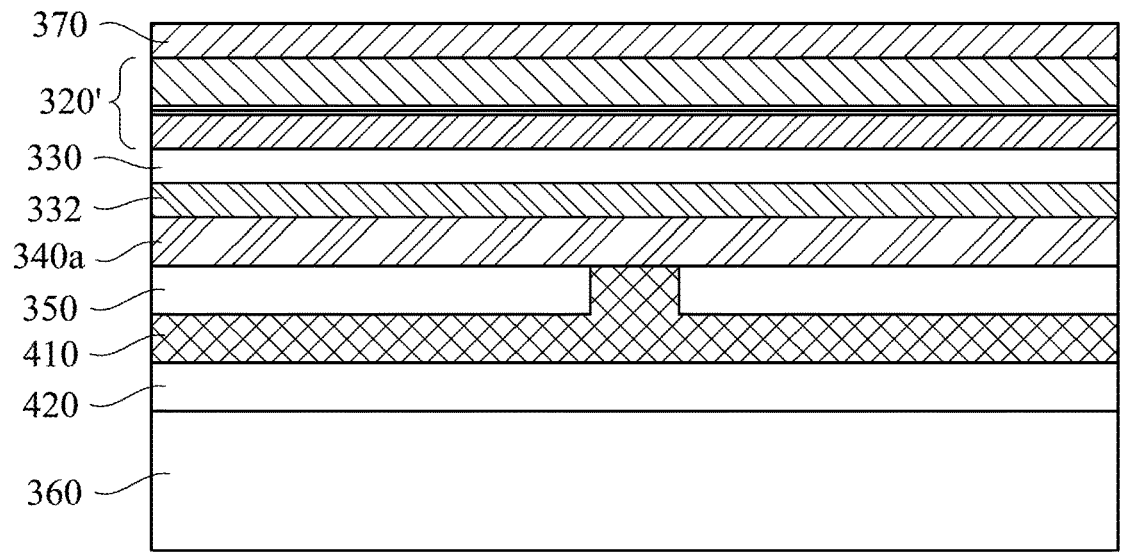
FIG. 17 to FIG. 25 are cross-sectional views illustrating various process stages of manufacturing the light emitting diode structure, in accordance with another embodiment of the present invention.

Another embodiment of the present invention is to provide a method for manufacturing a light emitting diode structure 10. FIG. 17 to FIG. 25 are cross-sectional views illustrating various process stages of manufacturing the light emitting diode structure 10, in accordance with some embodiments of the present invention. As shown in FIG. 17, a precursor structure is provided first. The precursor structure 50 includes an electrode layer 370, a semiconductor stack 320', an ohmic contact layer 330, a base layer 340a, a sacrificial layer 350, a supporting layer 410, and a carrier substrate 360 stacked from top to bottom in sequence. In one embodiment, the precursor structure 50 may further include a metal layer 332 disposed between the ohmic contact layer 330 and the base layer 340a. In another embodiment, the precursor structure 50 may further include an adhesive layer 420 disposed between the supporting layer 410 and the carrier substrate 360. The description below is made to describe the embodiments of the precursor structure 50 including the metal layer 332 and the adhesive layer 420.

Figure 18:
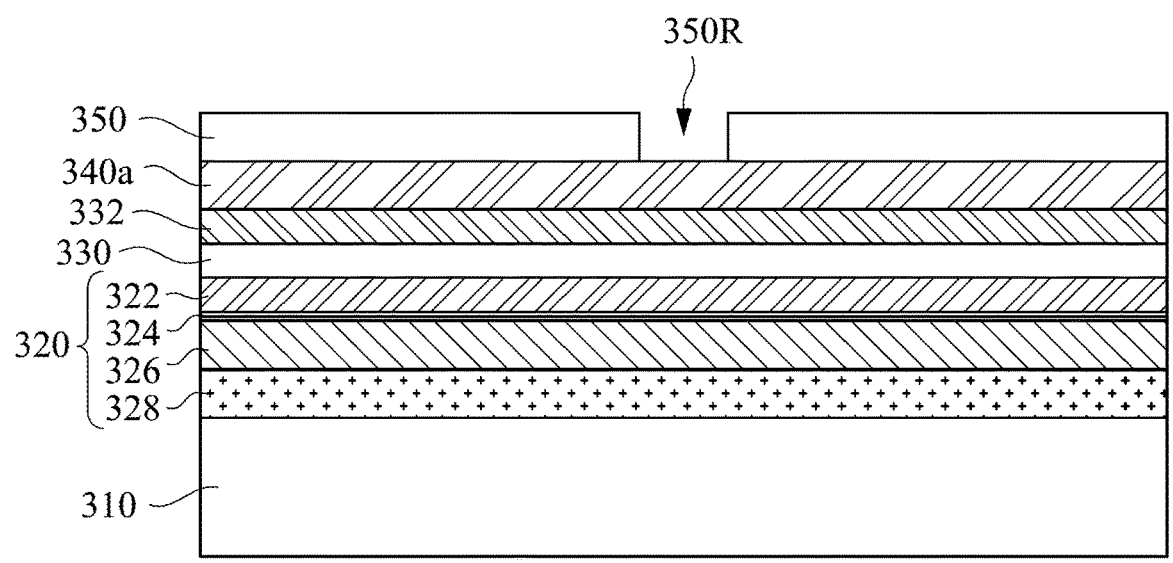

FIG. 18 to FIG. 22 are cross-sectional views illustrating various process stages of manufacturing the precursor structure mention above, in accordance with one embodiment of the present invention. Referring to FIG. 18, an epitaxial stack 320, an ohmic contact layer 330, a metal layer 332, a base layer 340a, and a sacrificial layer 350 are formed in sequence on the growth substrate 310 from bottom to top. In particular, the epitaxial stack 320 includes an undoped semiconductor layer 328, a second type semiconductor layer 326, a light emitting layer 324, and a first type semiconductor layer 322 are stacked on the growth substrate 310 in sequence. It should be noted that the sacrificial layer 350 has an opening 350R exposing a portion of the base layer 340a.

Figure 19:
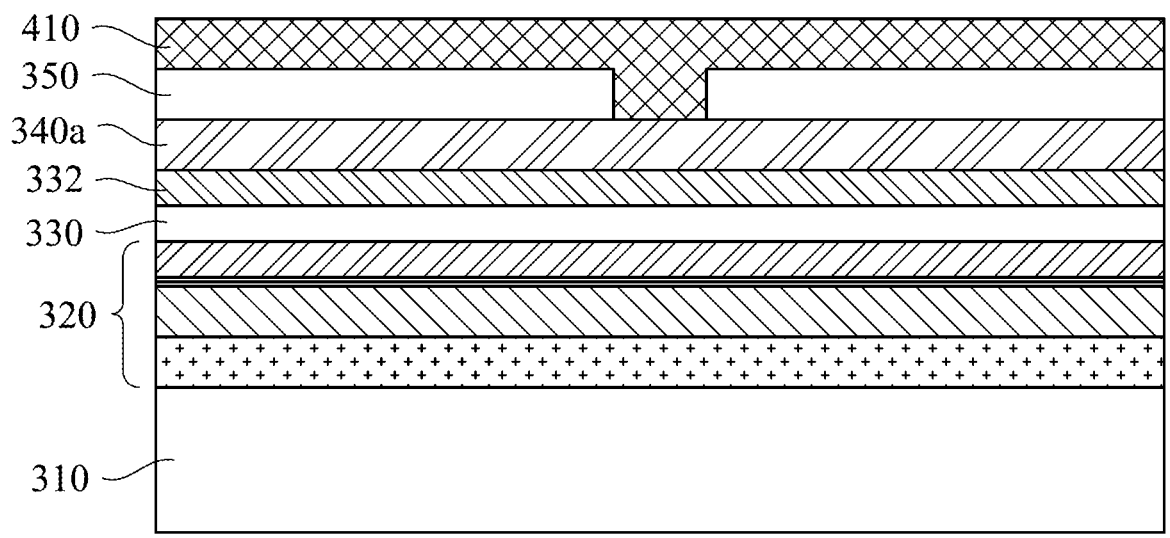

Next, a supporting layer 410 is formed and covers the sacrificial layer 350 and fills the opening 350R as shown in FIG. 19. In some embodiments, the supporting layer 410 may include insulating materials, metallic materials, or other supporting materials. For example, the insulating materials include silicon dioxide, silicon nitride, silicon oxynitride, and epoxy resin; and the metallic materials include aluminum, titanium, gold, platinum, or nickel, but not limited thereto.

Figure 20:
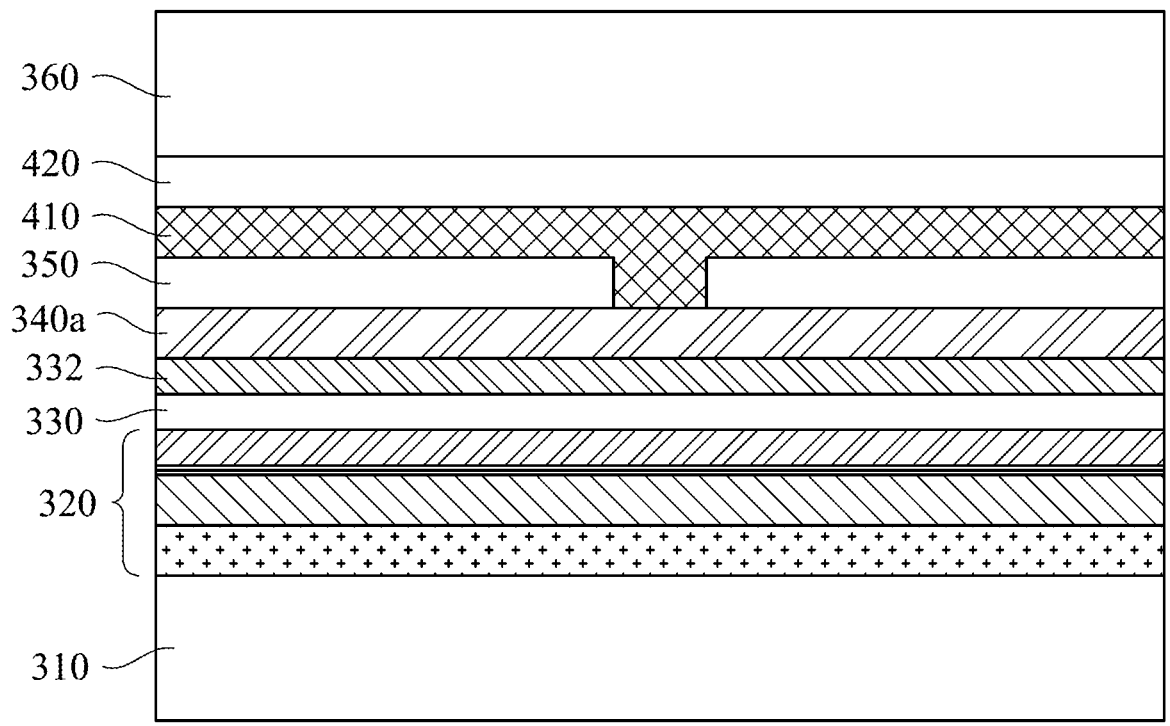

Referring to FIG. 20, the carrier substrate 360 is subsequently formed on the supporting layer 410. In some embodiments, the carrier substrate 360 can be adhered to the supporting layer 410 by an adhesive layer 420 to enhance the adhesion between the carrier substrate 360 and the supporting layer 410. In one embodiment, the materials of the adhesive layer 420 may include insulation glue, conductive glue and/or metals. For example, the materials of the adhesive layer 420 may be insulation glue such as an epoxy resin or a silicone; the materials of the adhesive layer 420 may be conductive glue such as an epoxy resin mixed with silver powders; the materials of the adhesive layer 420 may be a metal such as copper, aluminum, tin, gold, indium and/or silver, but not limited thereto. It should be stated that after forming the carrier substrate 360, the structure as shown in FIG. 20 is flipped upside down so that the growth substrate 310 is at the top and the carrier substrate 360 is at the bottom.

Figure 21:
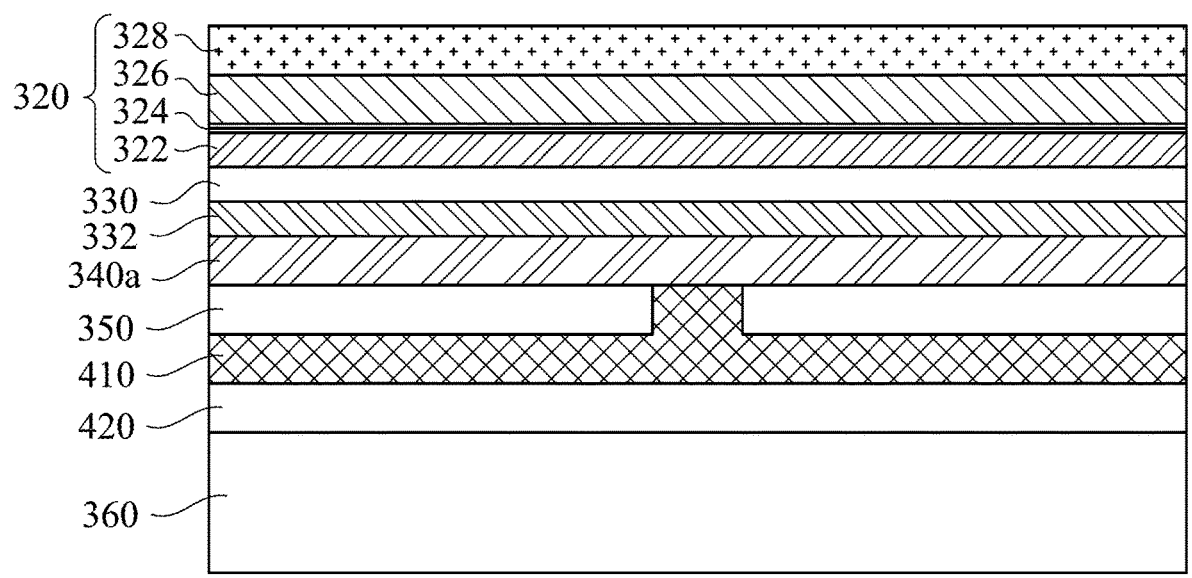

Referring to FIG. 21, the growth substrate 310 is then removed. In some embodiments, the growth substrate 310 may be removed by laser lift-off (LLO), gridding, or etching processes. In particular, the growth substrate 310 is removed to expose the undoped semiconductor layer 328 of the epitaxial stack 320.

Figure 22:
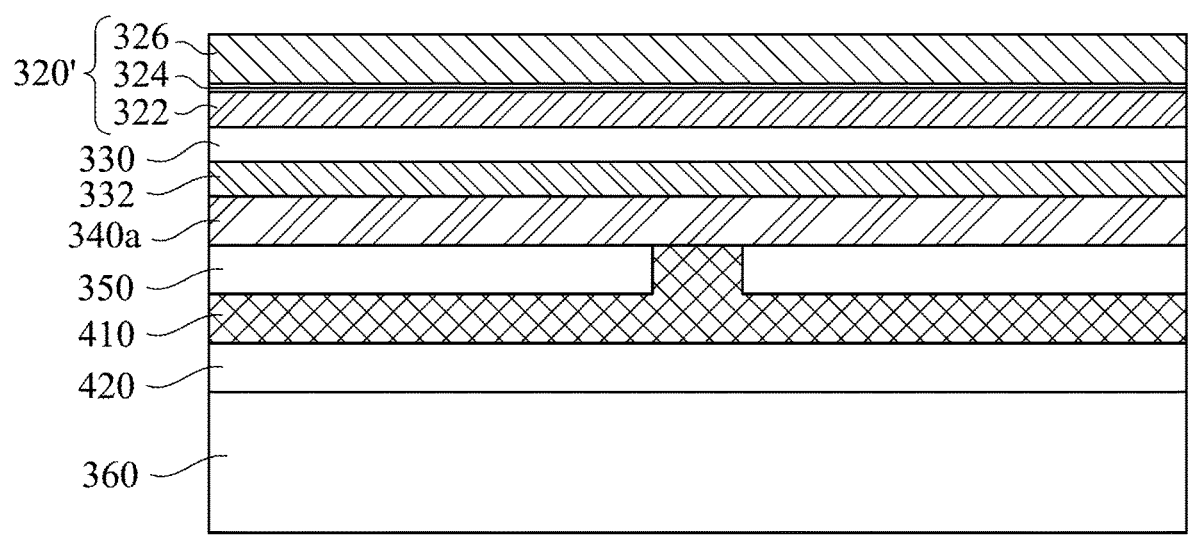

Referring to FIG. 22, subsequently, a portion of the epitaxial stack 320 is removed to form a semiconductor stack 320'. More specifically, the undoped semiconductor layer 328 of the epitaxial stack 320 is not conductive, so the undoped semiconductor layer 328 of the epitaxial stack 320 is completely removed in this step, and the second type semiconductor layer 326 is exposed. After this step, the semiconductor stack 320' (i.e., the remaining epitaxial stack) includes the second type semiconductor layer 326, the light emitting layer 324, and the first type semiconductor layer 322 stacked on the ohmic contact layer 330 from top to bottom in sequence. Then, the electrode layer 370 is formed on the semiconductor stack 320' to complete the precursor structure 50 as shown in FIG. 17.

Figure 23:
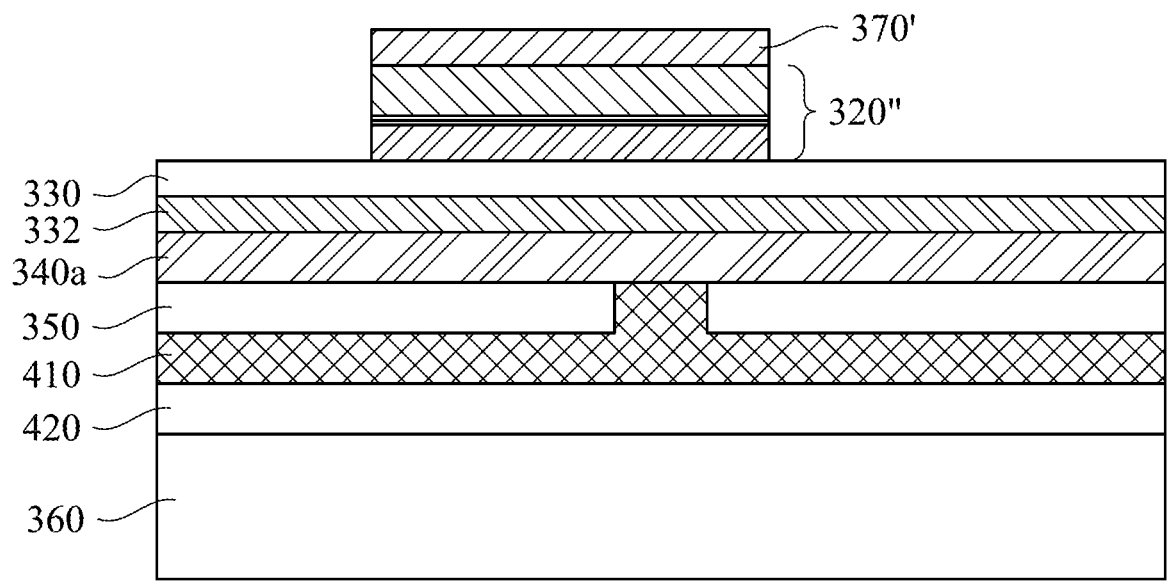
Figure 24:
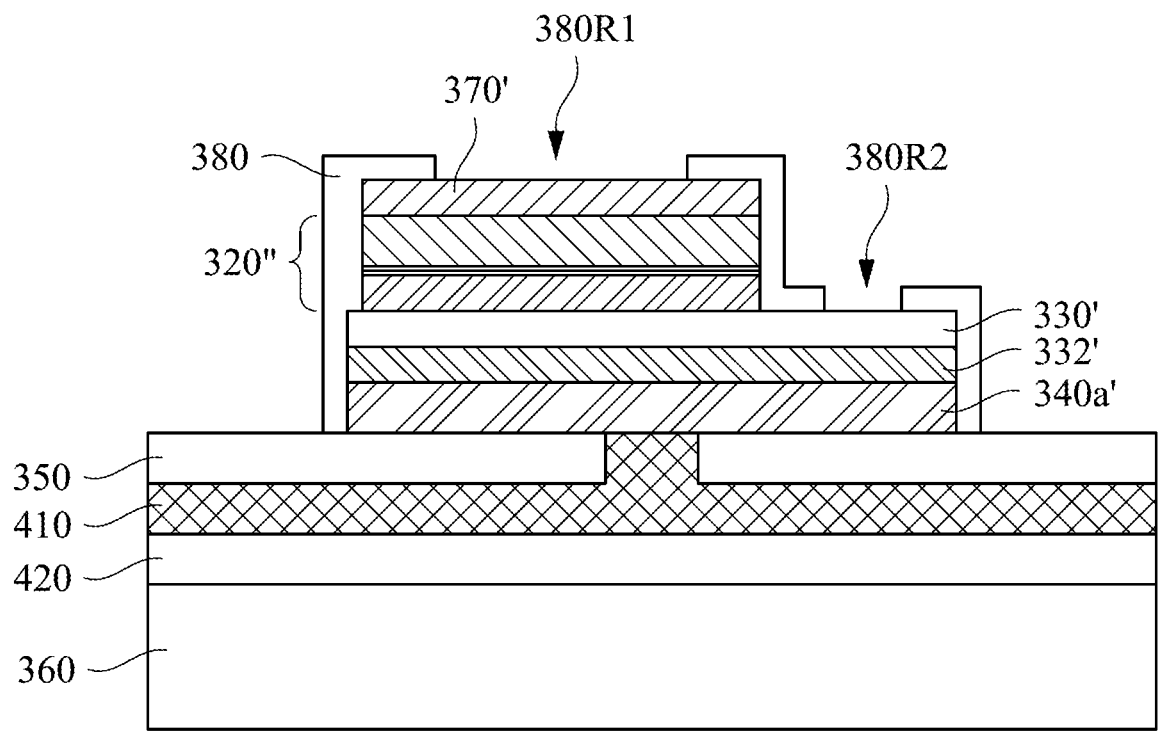

Next, a portion of the electrode layer 370, a portion of the semiconductor stack 320', a portion of the ohmic contact layer 330, a portion of the metal layer 332, and a portion of the base layer 340a in the precursor structure 50 as shown in FIG. 17 are removed to expose the sacrificial layer 350. FIG. 23 to FIG. 24 are cross-sectional views illustrating an approach of implementing this step according to one embodiment of the present invention. There are two removal processes included in this step. As shown in FIG. 23, in one embodiment, the first removal process may utilize a lithography process to remove a portion of the electrode layer 370 and a portion of the semiconductor stack 320' so to expose the ohmic contact layer 330. In this embodiment, the remaining semiconductor stack 320" and the remaining electrode layer 370' have substantially the same width.

In one embodiment, the second removal process may utilize a lithography process to remove the portion of the ohmic contact layer 330, the portion of the metal layer 332, and the portion of the base layer 340a so that the sacrificial layer 350 is exposed, as shown in FIG. 24. In this embodiment, the remaining ohmic contact layer 330', the remaining metal layer 332', and the remaining base layer 340a' have substantially the same width. The width of the remaining ohmic contact layer 330' is greater than the width of the remaining semiconductor stack 320". In actual operations, a certain sidewall of the remaining ohmic contact layer 330' is not accurately aligned (or flushed) with the sidewall of the same side of the remaining semiconductor stack 320" due to process tolerances in the second removal process.

Referring to FIG. 24, an insulation layer 380 is formed continuously to cover the remaining base layer 340a', the remaining metal layer 332', the remaining ohmic contact layer 330', the remaining semiconductor stack 320", and the remaining electrode layer 370'. It should be noted that the insulation layer 380 does not completely cover the sacrificial layer 350. That is, a portion of the sacrificial layer 350 is exposed. Thereafter, in one embodiment, a first opening 380R1 and a second opening 380R2 may be formed in the insulation layer 380 by lithography etching to expose a portion of the remaining electrode layer 370' and a portion of the remaining ohmic contact layer 330', respectively.

Figure 25:
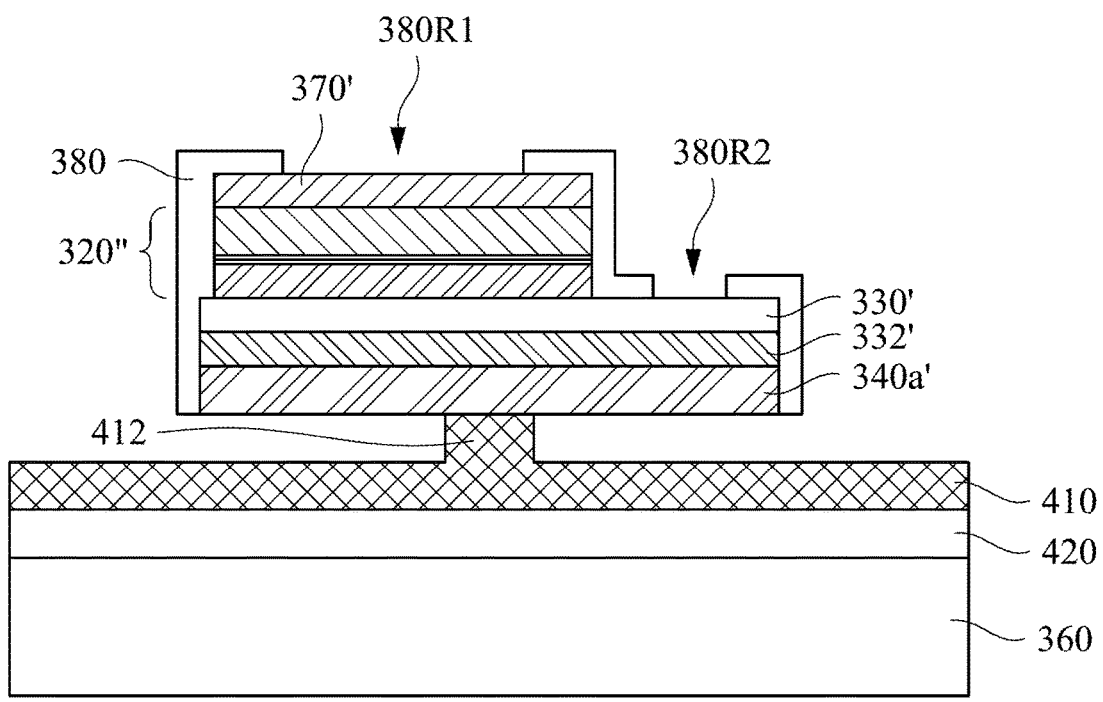

Referring to FIG. 25, the sacrificial layer 350 is removed. More specifically, the sacrificial layer 350 may be removed from the exposed portion of the sacrificial layer 350 by using an etching solution. After the sacrificial layer 350 is etched, a portion of the supporting layer 410 may constitute a supporter 412. The insulation layer 380, the remaining electrode layer 370', the remaining semiconductor stack 320", the remaining ohmic contact layer 330', the remaining metal layer 332', and the remaining base layer 340a' are suspended over the supporting layer 410 by the supporter 412. Since only the supporter 412 is left to support the upper structure after removing the sacrificial layer 350, it is easy to break the supporter 412. In addition, in some embodiments, only a portion of the sacrificial layer 350 is removed. For example, a portion of the sacrificial layer 350 is removed from the upper surface of the sacrificial layer 350 such that the insulation layer 380, the remaining electrode layer 370', the remaining semiconductor stack 320", the remaining ohmic contact layer 330', the remaining metal layer 332', and the remaining base layer 340a' are suspended over the sacrificial layer 350. That is to say, it is not necessary to remove the complete sacrificial layer 350 as long as the supporter 412 can be broken. In FIG. 25, the insulation layer 380 covers at least a sidewall of the remaining base layer 340a', a sidewall of the remaining metal layer 332', a sidewall of the remaining ohmic contact layer 330', a sidewall of the remaining semiconductor stack 320", and a sidewall of the remaining electrode layer 370', and a portion of the remaining electrode layer 370' and a portion of the remaining ohmic contact layer 330' are exposes. In some embodiments, the insulation layer 380 may cover the other portion of the top surface of the remaining electrode layer 370'.

Referring to FIG. 25, the supporter 412 of the supporting layer 410 is intentionally to be broken, thereby forming an individual light emitting diode structure. In one embodiment, when the supporter 412 is broken, a residual portion of the supporter 412 may remain on the individual light emitting diode structure, and the residual portion of the supporter 412 will not be cleaned off. In another embodiment, when the supporter 412 is broken, a residual portion of the supporter 412 may not remain on the individual light emitting diode structure. In some embodiments, the individual light emitting diode structure may be disposed on the bonding substrate 170 to form the light emitting diode structure 10 as shown in FIG. 1A. In addition, the adhesive layer 160 may be disposed between the bonding substrate 170 and the individual light emitting diode structure to enhance the adhesion there between. More specifically, the residual portion of the supporter 412 on the individual light emitting diode structure would be covered by the adhesive layer 160. Therefore, in appearance, the light emitting diode structure 10 shown in FIG. 1A are still formed. The various features of the light emitting diode structure 10 shown in FIG. 1A have been described hereinbefore, and the details are not repeated herein. It is noted that the processes and operations described above are illustrated for examples only, and each operation can be arbitrarily changed according to the requirements. In some embodiments, additional operations can be performed before, during or after the process above.

Yet another aspect of the present invention is to provide a method for manufacturing a micro light emitting diode structure 20. FIG. 26 to FIG. 38B are cross-sectional views illustrating various process stages of manufacturing the light emitting diode structure 20, in accordance with another embodiment of the present invention.

Figure 26:
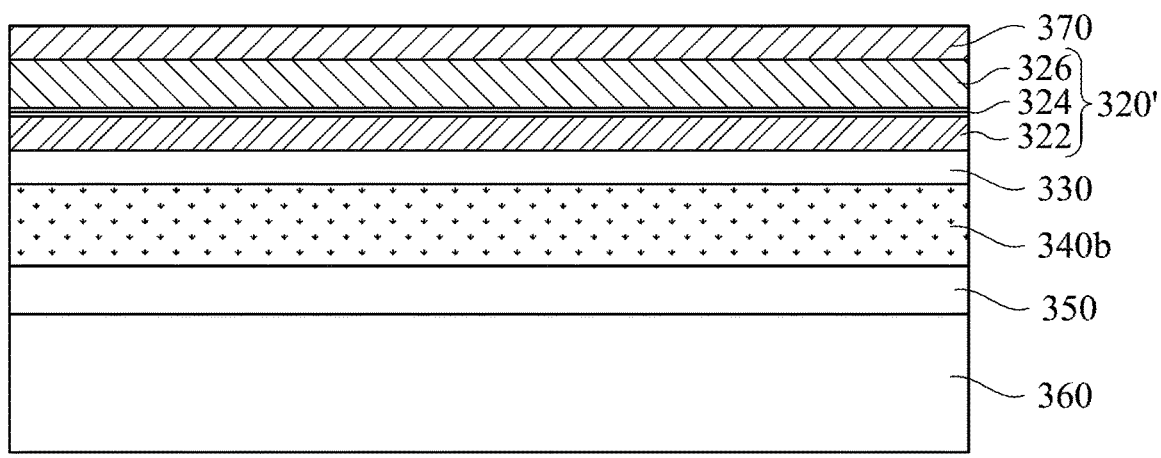
FIG. 26 to FIG. 34 are cross-sectional views illustrating various process stages of manufacturing the light emitting diode structure, in accordance with another embodiment of the present invention.
Figure 27:
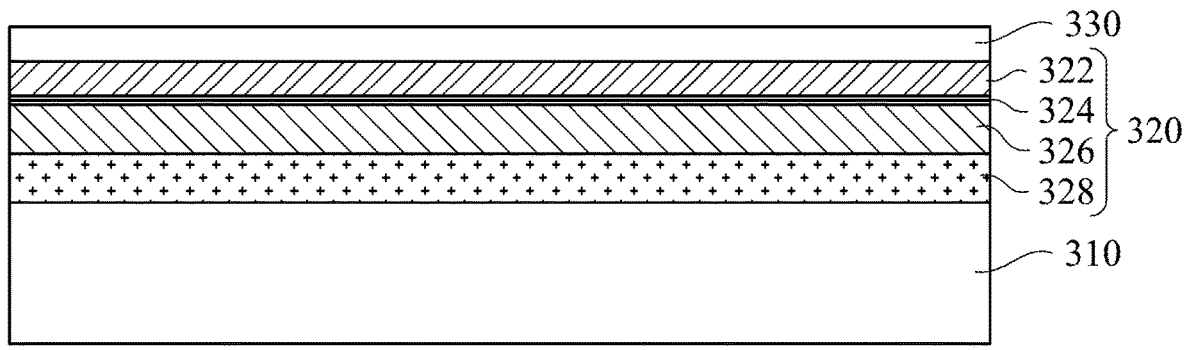

As shown in FIG. 26, a precursor structure 60 is provided first. The precursor structure 60 includes an electrode layer 370, a semiconductor stack 320', an ohmic contact layer 330, a base layer 340b, a sacrificial layer 350, and a carrier substrate 360 stacked from top to bottom in sequence. FIG. 27 to FIG. 30 are cross-sectional views illustrating various process stages of manufacturing the precursor structure mention above, in accordance with one embodiment of the present invention. To make it easy to compare differences between various embodiments and simplify the descriptions, the same symbols are used to label the same members in the following various embodiments and mainly the differences between the various embodiments are described while repetitive parts are not described again. Referring to FIG. 27, an epitaxial stack 320 and an ohmic contact layer 330 are sequentially formed on the growth substrate 310 from bottom to top.

Figure 28:
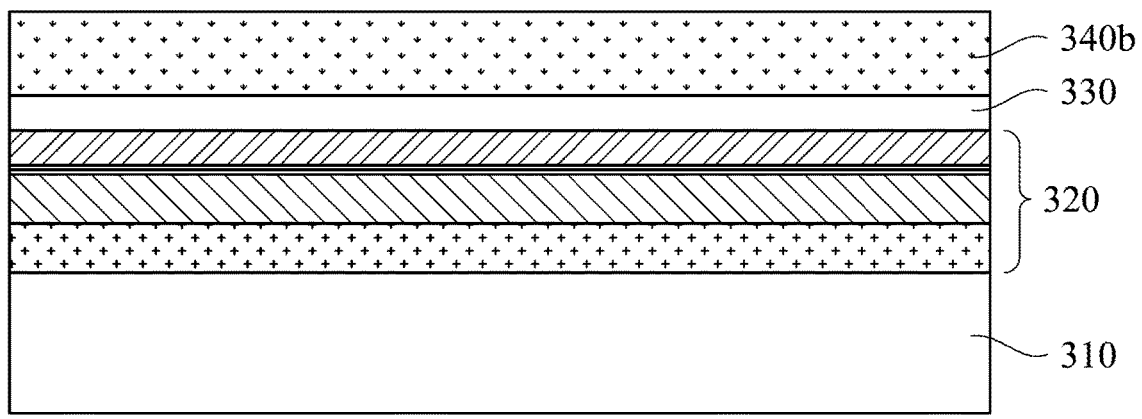

Next, referring to FIG. 28, the base layer 340b is formed on the ohmic contact layer 330. In the present embodiment, the base layer 340b includes a distributed bragg reflector (DBR). The embodiments of the distributed bragg reflector has been described hereinbefore, and the details are not repeated herein. It is noted that, in the present embodiment, when the base layer 340b includes the distributed bragg reflector, the ohmic contact layer 330 must include only light-transmitting conductive materials such as for example indium tin oxide (ITO), IZO, AZO, or materials with light-transmitting and conductive properties.

Figure 29:
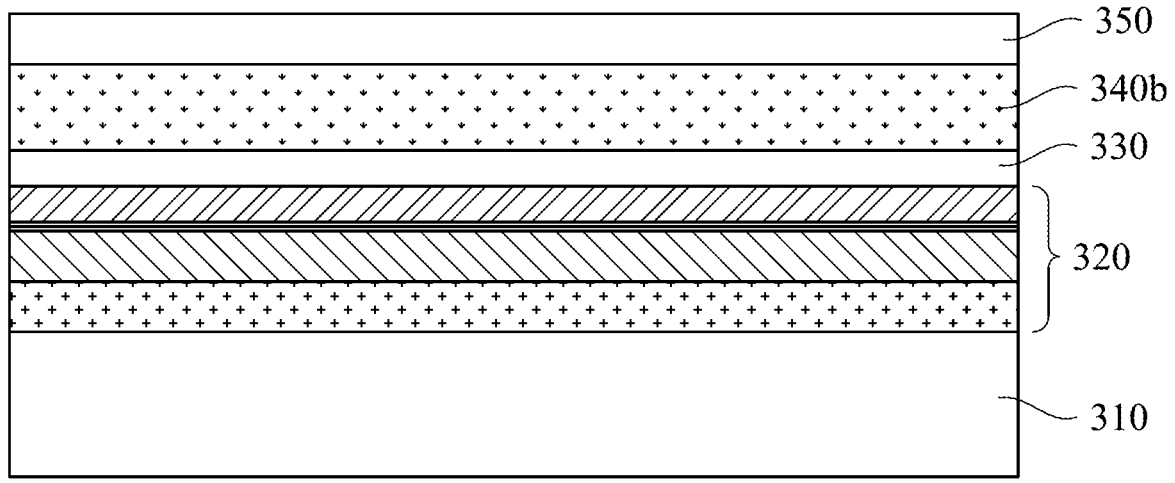

Referring to FIG. 29, the sacrificial layer 350 is formed on the base layer 340b. In various embodiments, the sacrificial layer 350 includes benzocyclobutene (BCB) or polyimide (PI).

Figure 30:
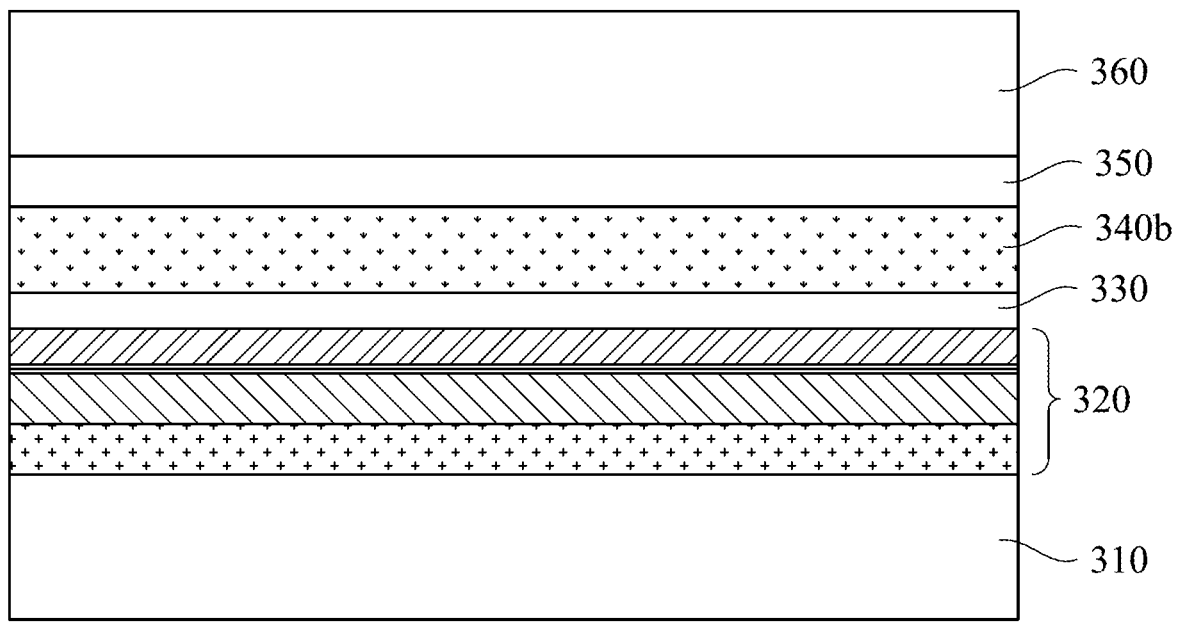

Referring to FIG. 30, the carrier substrate 360 is then formed on the sacrificial layer 350. In various embodiments, the carrier substrate 360 may be a silicon substrate or other suitable substrates. It should be stated that after forming the sacrificial layer 350 on the carrier substrate 360, the structure as shown in FIG. 30 is flipped upside down so that the growth substrate 310 is at the top and the carrier substrate 360 is at the bottom.

Figure 31:
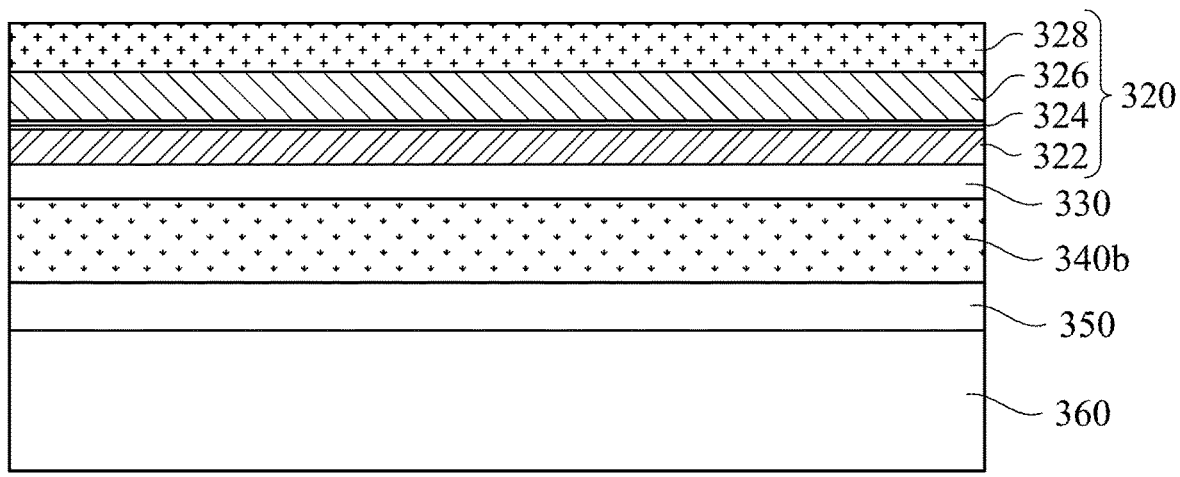

Referring to FIG. 31, the growth substrate 310 is removed. In some embodiments, the growth substrate 310 may be removed by laser lift-off (LLO), grinding, or etching processes. In particular, the growth substrate 310 is removed to expose the undoped semiconductor layer 328 of the epitaxial stack 320.

Figure 32:
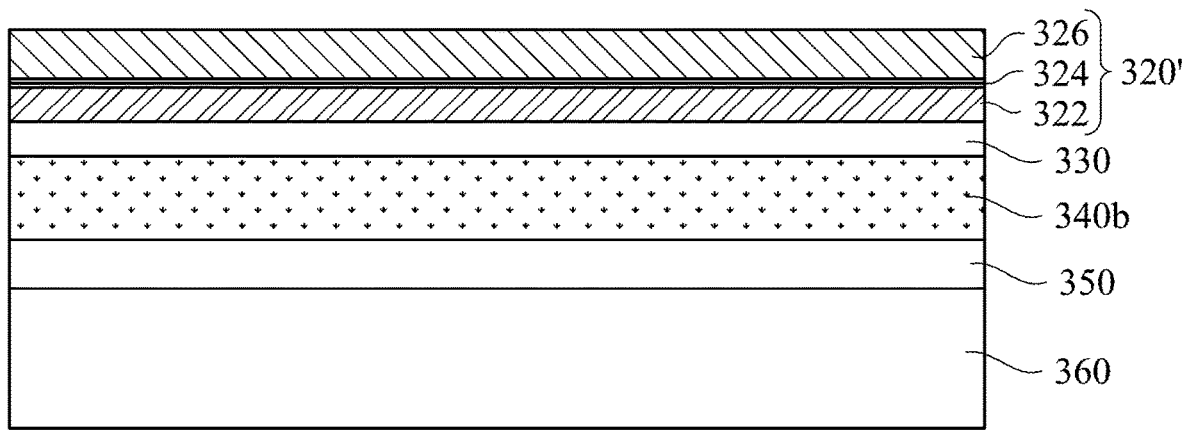

Referring to FIG. 32, subsequently, a portion of the epitaxial stack 320 is removed to form a semiconductor stack 320'. More specifically, the undoped semiconductor layer 328 of the epitaxial stack 320 is not conductive, so the undoped semiconductor layer 328 of the epitaxial stack 320 is completely removed in this step and the second type semiconductor layer 326 is exposed. After this step, the semiconductor stack 320' (that is the remaining epitaxial stack) includes the second type semiconductor layer 326, the light emitting layer 324, and the first type semiconductor layer 322 stacked on the ohmic contact layer 330 from top to bottom in sequence.

Then, the electrode layer 370 is formed on the semiconductor stack 320' to complete the precursor structure 60 as shown in FIG. 26. In one embodiment, the electrode layer 370 includes light-transmitting conductive materials. For example, the light-transmitting conductive material may include indium tin oxide (ITO), IZO, AZO, or materials with light-transmitting and conductive properties. In addition, since the light-transmitting conductive materials mentioned above has a good electrical conductivity, the surface resistance of the second type semiconductor layer 326 may be reduced, thereby decreasing the driving voltage of the light emitting diode and reducing the difficulty in the process of manufacturing the electrode layer 370. In another embodiment, electrode layer 370 may include opaque metal materials. For example, the opaque metal material may include Cr, GeAu, Au, Ti, Al, or the like.

Figure 33:
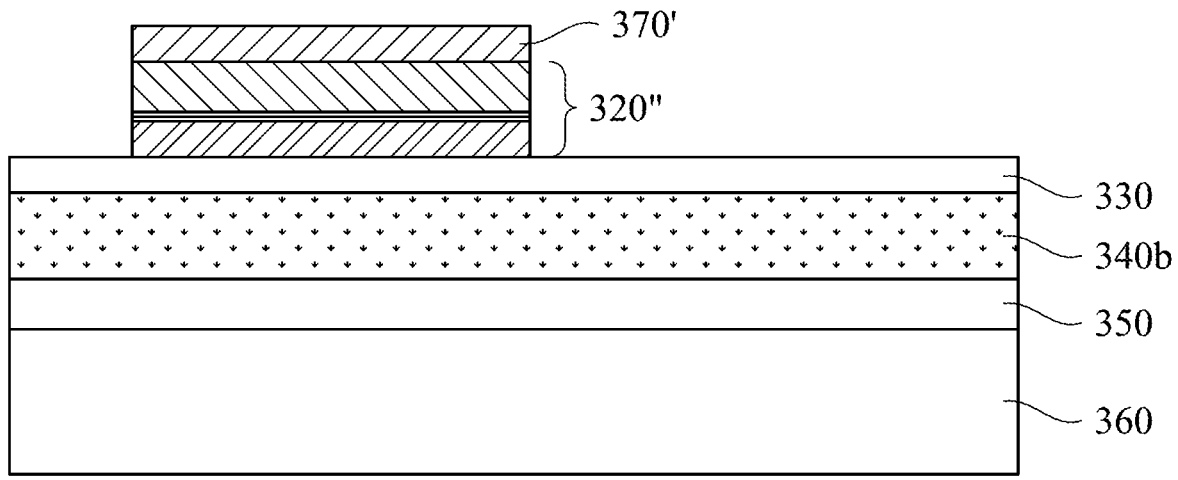
Figure 34:
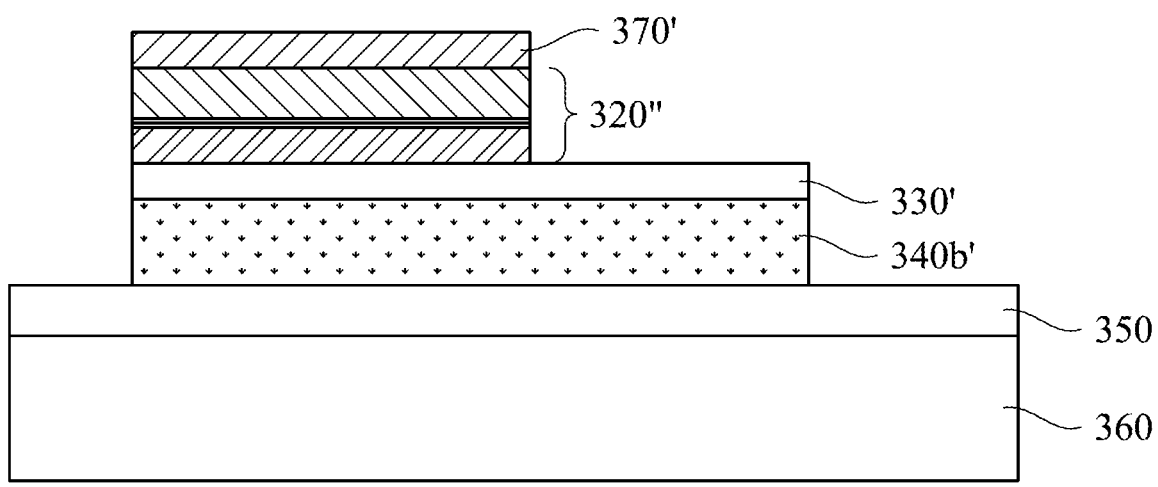

Next, a portion of the electrode layer 370, a portion of the semiconductor stack 320', a portion of the ohmic contact layer 330, and a portion of the base layer 340b in the precursor structure 60 are removed to expose the sacrificial layer 350. FIG. 33 to FIG. 34 are cross-sectional views illustrating an approach for implementing this step according to one embodiment of the present invention. There are two removal processes included in this step. As shown in FIG. 33, the first removal process may utilize a lithography process to remove a portion of the electrode layer 370 and a portion of the semiconductor stack 320' so to expose the ohmic contact layer 330. In the embodiment where the electrode layer 370 includes light-transmitting conductive materials, the width of the remaining semiconductor stack 320" after etching is substantially equal to the width of the remaining electrode layer 370'. In the embodiment where the electrode layer 370 includes opaque metal materials, in order not to affect the light extraction efficiency of the light emitting diode, the width of the remaining electrode layer 370' after etching is usually smaller than the width of the remaining semiconductor stack 320". For example, the width of the remaining electrode layer 370' is as small as possible to so long as it is sufficient to provide a contact area for the external wires.

Referring to FIG. 34, the second removal process may utilize a lithography process to remove a portion of the ohmic contact layer 330 and a portion of the base layer 340b so to expose the sacrificial layer 350. To be specific, the width of the remaining ohmic contact layer 330' is substantially equal to the width of the remaining base layer 340b, and the width of the remaining ohmic contact layer 330' is greater than the width of the remaining semiconductor stack 320".

Figure 35:
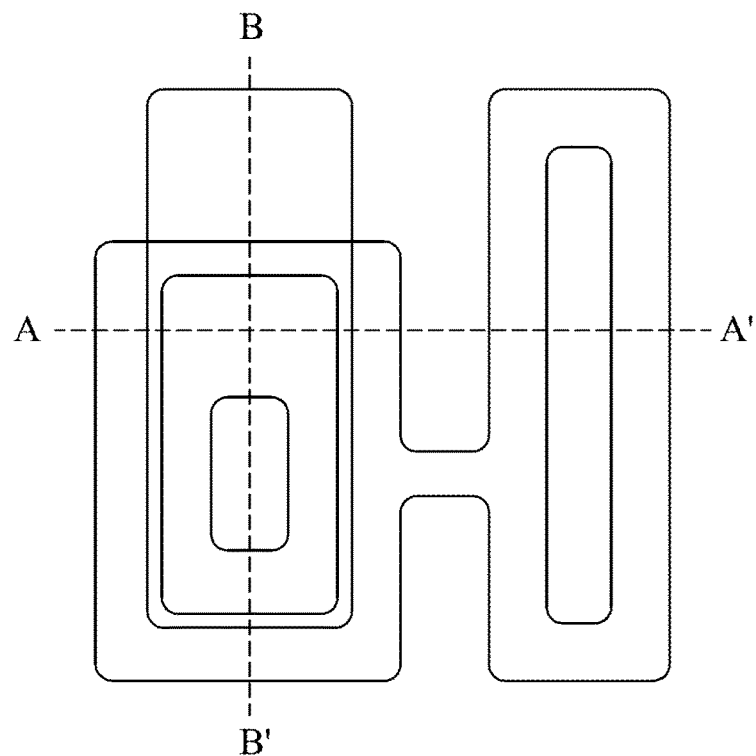
FIG. 35 is top view illustrating one process stage of manufacturing the light emitting diode structure, in accordance with another embodiment of the present invention.

FIG. 35 illustrates a top view in one process stage of manufacturing the light emitting diode structure 20. FIG. 36 to FIG. 38A are cross-sectional views along line A-A' in FIG. 35, that illustrate various process stages of manufacturing the light emitting diode structure 20, in accordance with the some embodiments. FIG. 38B is a cross-sectional view, along line B-B' in FIG. 35, illustrating one process stage of manufacturing the light emitting diode structure 20. It should be noted that, due to the position of the line A-A', the remaining base layer 340b', the remaining ohmic contact layer 330', the remaining semiconductor stack 320", and the remaining electrode layer 370' shown in FIG. 36 to FIG. 38A have the same width.

Figure 36:
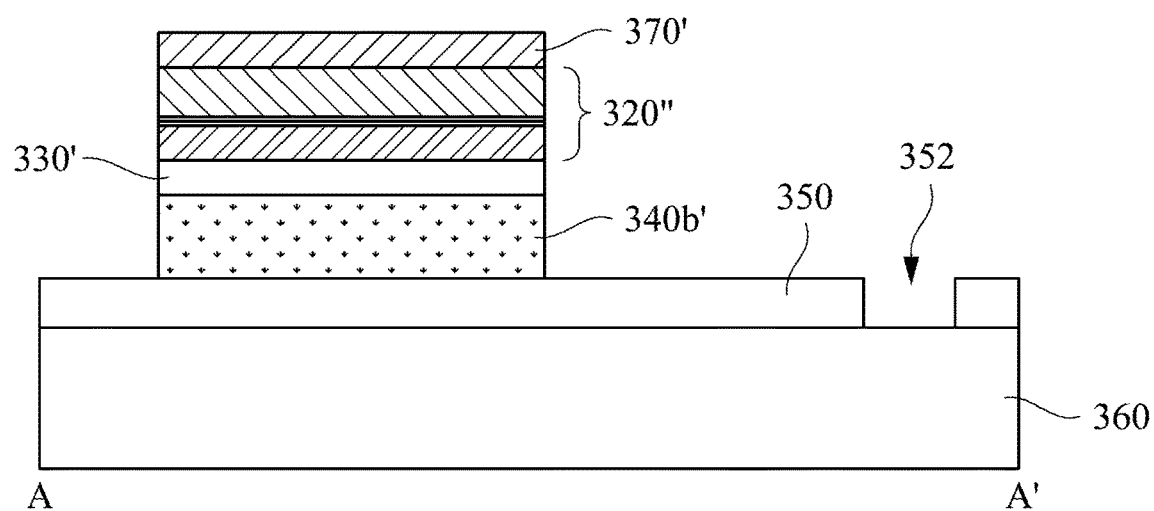

Referring to FIG. 35 and FIG. 36, an opening 352 is formed in the sacrificial layer 350 to expose a portion of the carrier substrate 360.

Figure 37:
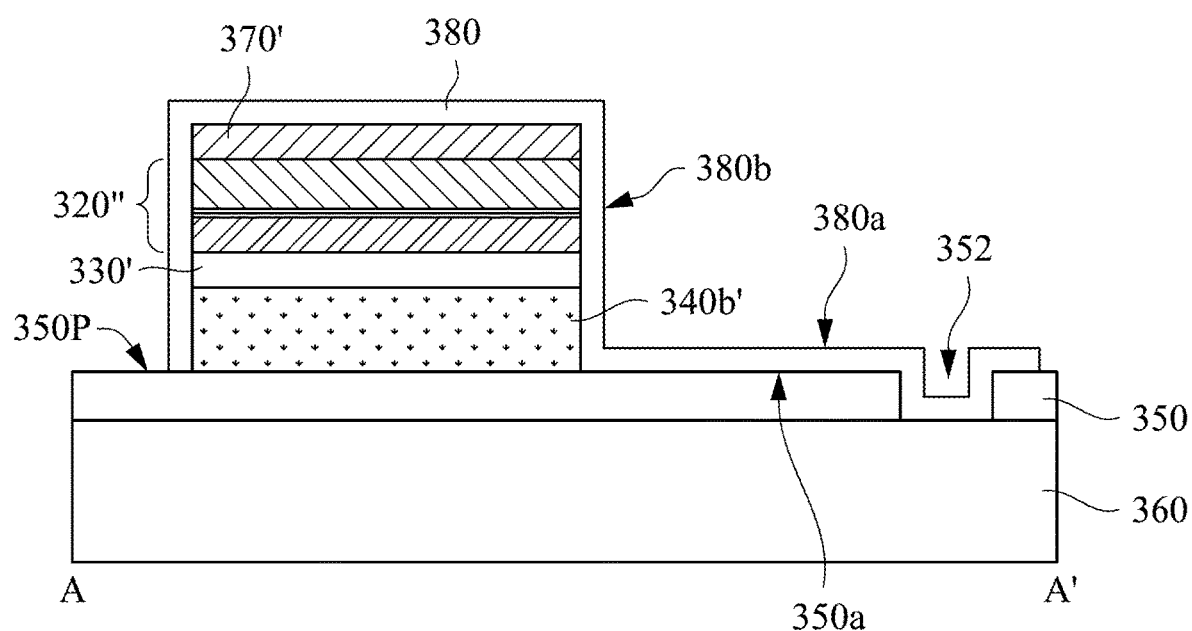

Referring to FIG. 37, an insulation layer 380 is formed to continuously cover the remaining base layer 340b', the remaining ohmic contact layer 330', the remaining semiconductor stack 320", the remaining electrode layer 370', a portion 350a of a top surface of the sacrificial layer 350, the opening 352, and the exposed portion of the carrier substrate 360. In particular, the insulation layer 380 has a first portion 380a covering the portion 350a of the top surface of the sacrificial layer 350, and the insulation layer 380 further has a second portion 380b coupling to the first portion 380a and covering a sidewall of the remaining multilayer structure (including 340b', 330', 320", and 370'). The first portion 380a and the second portion 380b of the insulation layer 380 constitute an "L" type. A portion of the sacrificial layer 350 uncovered by the insulation layer 380 (that is the exposed portion 350P) and the portion 350a, which is covered by the first portion 380a of the insulation layer 380, of the top surface of the sacrificial layer 350 are located on opposite sides of the remaining multilayer structure (including 340b', 330', 320", and 370').

Figure 38A:
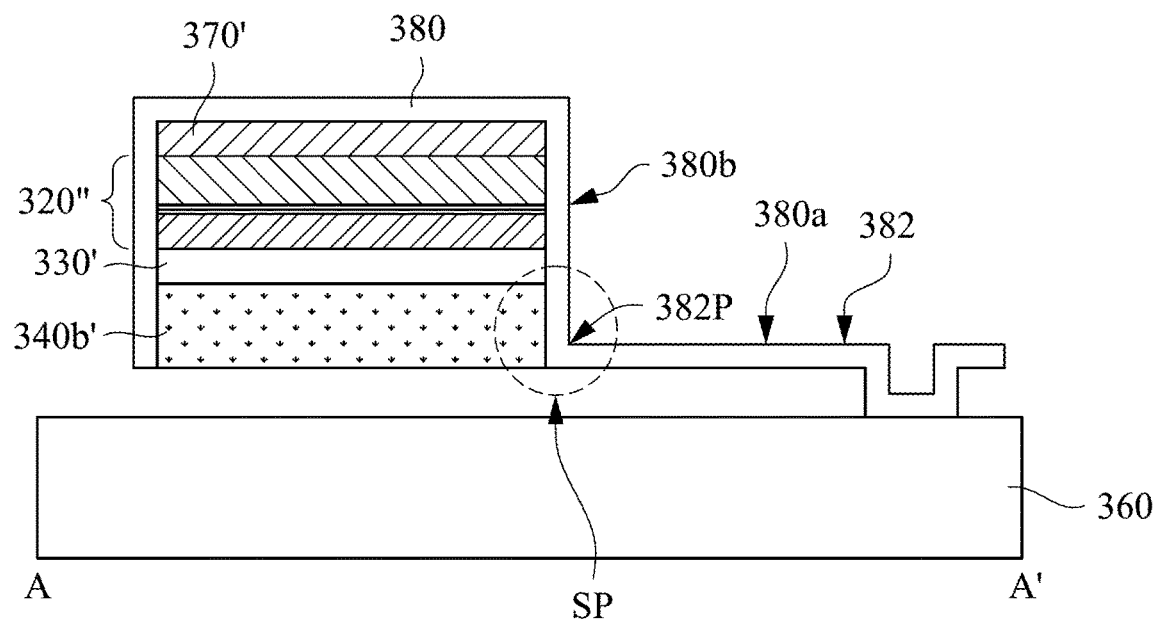
Figure 38B:
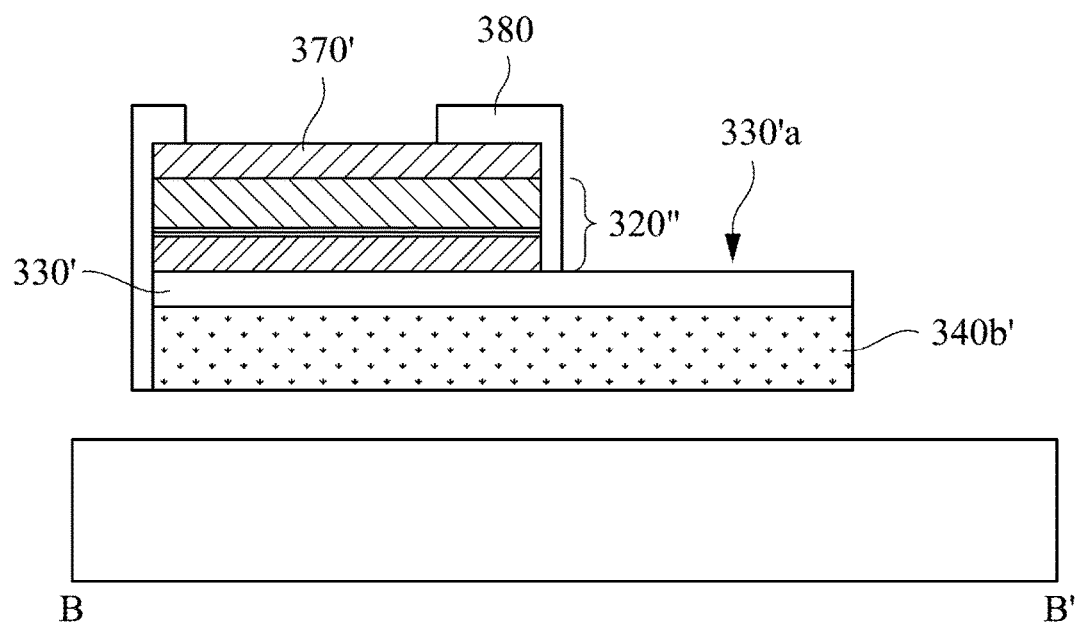
FIG. 38B is cross-sectional view illustrating one process stage of manufacturing the light emitting diode structure, along the line B-B' in FIG. 35.

Referring to FIG. 38A and FIG. 38B, the sacrificial layer 350 is removed. More specifically, the sacrificial layer 350 may be removed from the exposed portion 350P of the sacrificial layer by using an etching solution. As shown in FIG. 38A, after the sacrificial layer 350 is etched, a portion of the insulation layer 380 may constitute a supporter 382. The remaining electrode layer 370', the remaining semiconductor stack 320", the remaining ohmic contact layer 330', and the remaining base layer 340b' are suspended over the carrier substrate 360 by the supporter 382. Since only the supporter 382 is left to supports the upper structure after removing the sacrificial layer 350, it is easy to break the supporter 382. In addition, in some embodiments, only a portion of the sacrificial layer 350 is removed. For example, merely a portion of the sacrificial layer 350 is removed from the upper surface of the sacrificial layer 350 such that the remaining electrode layer 370', the remaining semiconductor stack 320", the remaining ohmic contact layer 330', and the remaining base layer 340b' are suspended over the carrier substrate 360. That is to say, it is not necessary to remove the complete sacrificial layer 350 as long as the supporter 382 can be broken. In FIG. 38B, the insulation layer 380 covers at least a sidewall of the remaining base layer 340b', a sidewall of the remaining ohmic contact layer 330', a sidewall of the remaining semiconductor stack 320", and a sidewall of the remaining electrode layer 370', and a portion 330'a of the top surface of the remaining ohmic contact layer 330' is exposed. The portion 330'a of the top surface of the remaining ohmic contact layer 330' is used as a stage for electrical contact. In some embodiments, the insulation layer 380 may also cover a portion of the top surface of the remaining electrode layer 370'.

Please referring back to FIG. 38A, the supporter 382 of the insulation layer 380 is intentionally to be broken, thereby forming an individual light emitting diode structure. It should be noted that after the operation of breaking the supporter 382, a supporting breakpoint SP would be formed in the individual light emitting diode structure. More specifically, the supporting breakpoint SP may include the supporter 382 broken at a transition position 382P of the first portion 380a and the second portion 380b, the supporter 382 broken at any position of the first portion 380a, or a sidewall on which a portion of the second portion 380b is detached from the remaining multilayer structure (340b', 330', 320", or 370'). In some embodiments, the individual light emitting diode structure may be disposed on the bonding substrate 170 to form the light emitting diode structure 20 shown in FIG. 2. In addition, the adhesive layer 160 may be formed on the bonding substrate 170 first, and then the individual light emitting diode structure may be disposed on the adhesive layer 160 to enhance the adhesion there between. The various features of the micro light emitting diode structure 20 shown in FIG. 2 have been described hereinbefore, and the details are not repeated herein. It is noted that the processes or operations described above are illustrated for examples only, and each operation can be arbitrarily changed according to the requirements. In some embodiments, additional operations can be performed before, during or after the process above.

Figure 39:
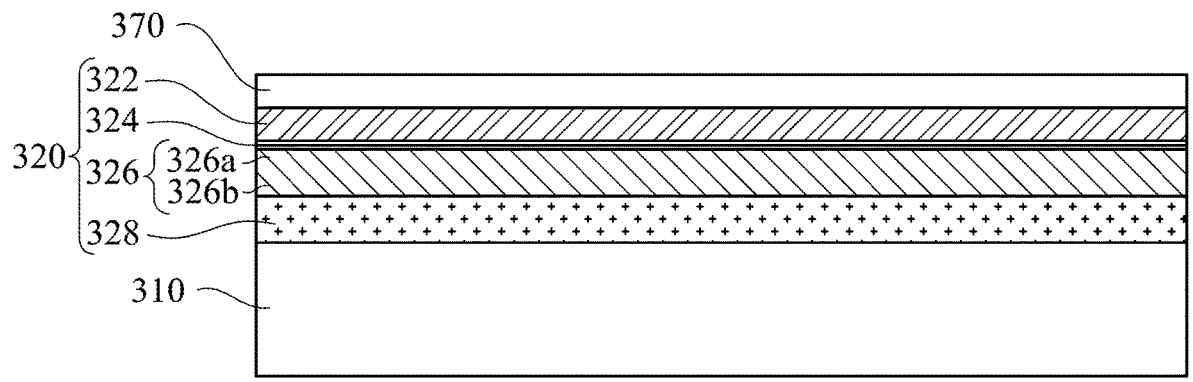
FIG. 39 to FIG. 50 are cross-sectional views illustrating various process stages of manufacturing the light emitting diode structure, in accordance with yet another embodiment of the present invention.

Yet another aspect of the present invention is to provide a method for manufacturing a micro light emitting diode structure 30. FIG. 39 to FIG. 50 are cross-sectional views illustrating various process stages of manufacturing the light emitting diode structure 30, in accordance with yet some embodiment of the present invention. To make it easy to compare differences between various embodiments and simplify the descriptions, the same symbols are used to label the same members in the following various embodiments and mainly the differences between the various embodiments are described while repetitive parts are not described again. As shown in FIG. 39, a precursor structure 70 is provided first. The precursor structure 70 includes an electrode layer 370 and an epitaxial stack 320 stacked on a growth substrate 310 from top to bottom in sequence. In particular, the epitaxial stack 320 includes a first type semiconductor layer 322, a light emitting layer 324, a second type semiconductor layer 326, and an undoped III-V group semiconductor layer 328 disposed on the growth substrate 310 from top to bottom, wherein the second type semiconductor layer 326 includes a first portion 326a and a second portion, and the first portion 326a is disposed on the second portion 326b.

Figure 40:
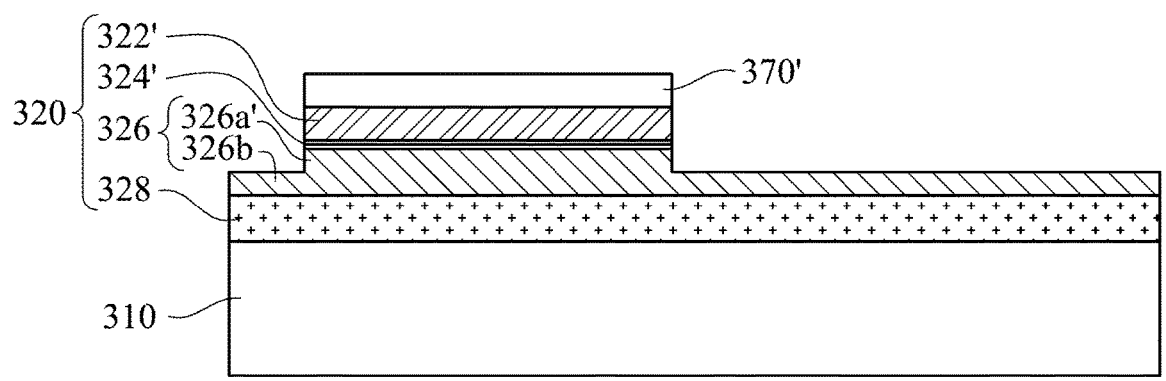

Referring to FIG. 40, a portion of the electrode layer 370 and a portion of the epitaxial stack 320 in the precursor structure 70 shown in FIG. 39 are removed such that a width of the remaining first portion 326a' is smaller than a width of the second portion 326b. More specifically, only a portion of the second type semiconductor layer 326 is removed during removal of the portion of the epitaxial stack 320 such that the second portion 326b of the second type semiconductor layer 326 is exposed. Therefore, after this removal step is completed, a width of the remaining electrode layer 370' is substantially equal to a width of the remaining first type semiconductor layer 322', a width of the remaining light emitting layer 324' is substantially equal to a width of the remaining first type semiconductor layer 322', and a width of the remaining first portion 326a' is substantially equal to a width of the remaining first type semiconductor layer 322'. In one embodiment, this step can be accomplished using a lithography process and controlling the time of the etch process.

Figure 41:
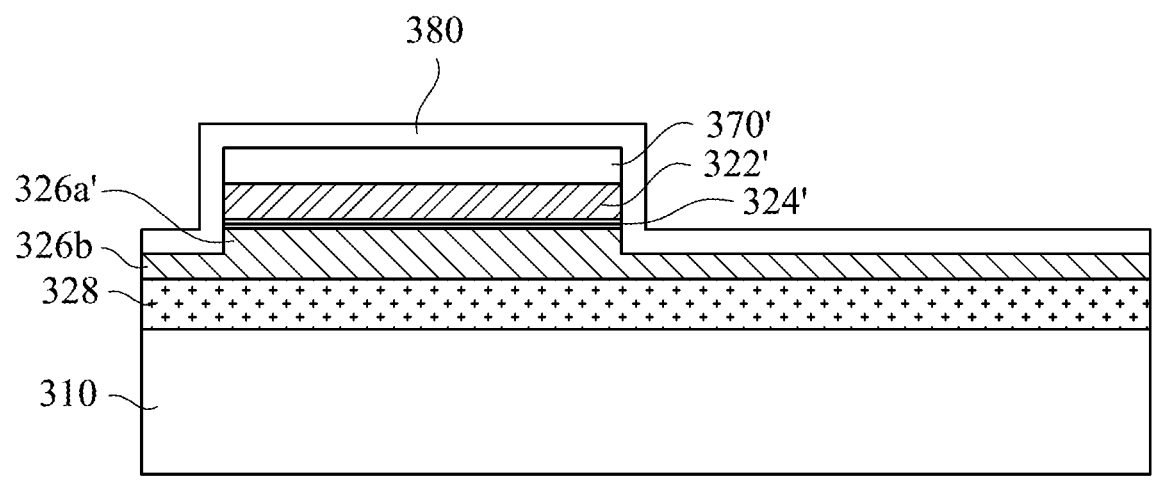

Referring to FIG. 41, an insulation layer 380 is formed to cover the remaining precursor structure 70' shown in FIG. 40. In particular, the insulation layer 380 is continuously covers the exposed surface of the second portion 326b of the second type semiconductor layer 326, the sidewall of the remaining first portion 326a' of the second type semiconductor layer 326, the sidewall of the remaining light emitting layer 324', the sidewall of the remaining first type semiconductor layer 322', and the sidewall and surface of the remaining electrode layer 370'.

Figure 42:
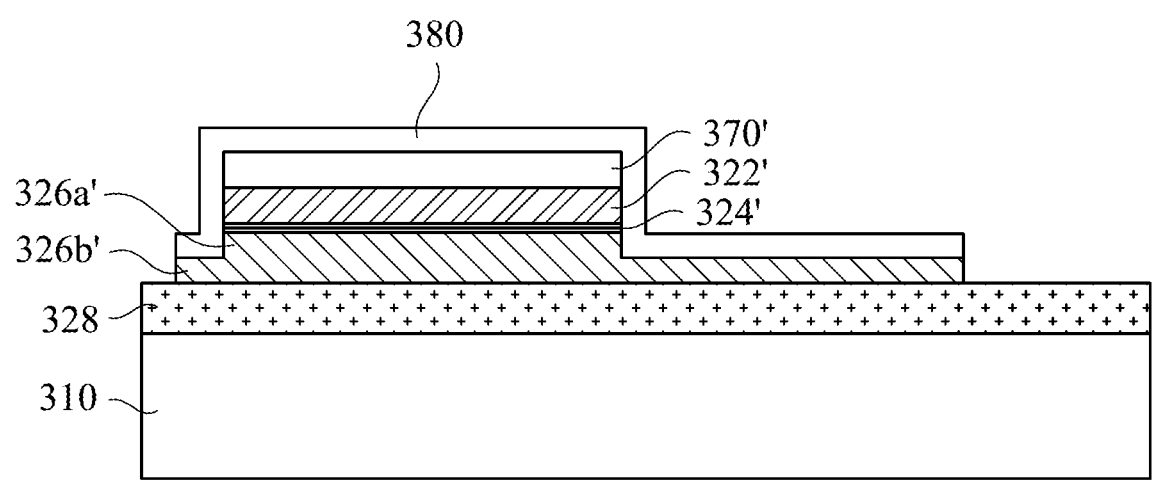

As shown in FIG. 42, a portion of the insulation layer 380 and a portion of the second portion 326b of the second type semiconductor layer 326 are then removed to expose the undoped semiconductor layer 328. In one embodiment, this step can be accomplished by using a photolithography process. It should be noted that, after this step is completed, a width of the second portion 326b' of the remaining second type semiconductor layer 326' must be greater than a width of the remaining first portion 326a'. Such design allows the second portion 326b' of the remaining second type semiconductor layer 326' to act as a stage for electrical contact.

Figure 43:
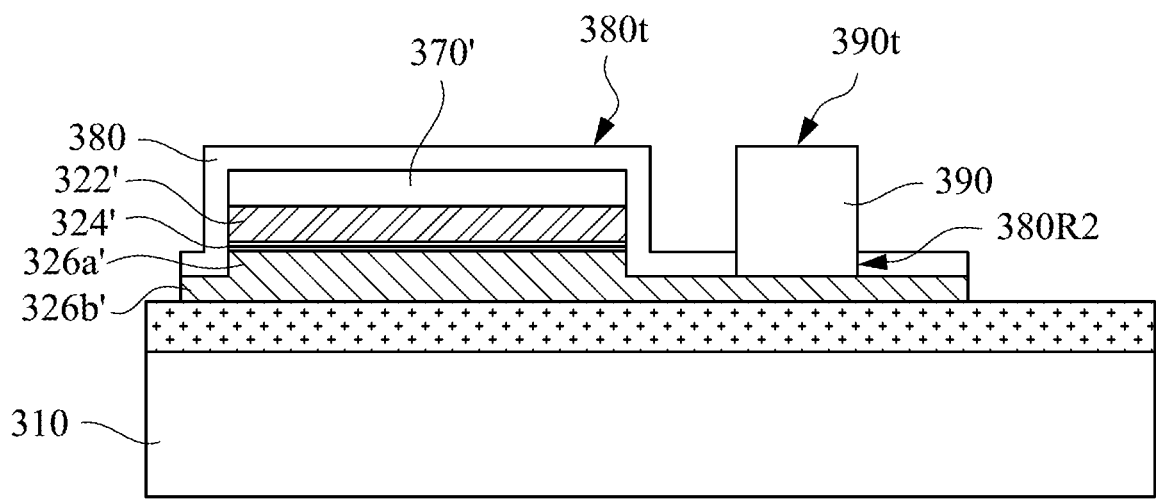

As shown in FIG. 43, in some embodiments, a conductive block 390 may be formed on the second portion 326b' of the remaining second type semiconductor layer 326'. In one embodiment, the method of forming the conductive block 390 includes, for example, the following steps. First, a patterned mask (not shown) is formed on the insulation layer 380, and the patterned mask has an opening (not shown) at a position where the conductive block 390 is expected to be formed. Thereafter, the opening 380R2 is formed to expose a part of the second portion 326b' of the remaining second type semiconductor layer 326'. And then, the conductive block 390 is formed in the opening 380R2 by sputtering, evaporation, electroplating, or electroless plating. In some embodiments, the conductive block 390 includes aluminum, copper, nickel, gold, platinum, titanium, or other suitable metal materials. In some embodiments, a top surface 380t of the insulation layer 380 on the remaining electrode layer 370' is substantially leveled with a top surface 390t of the conductive block 390.

Figure 44:
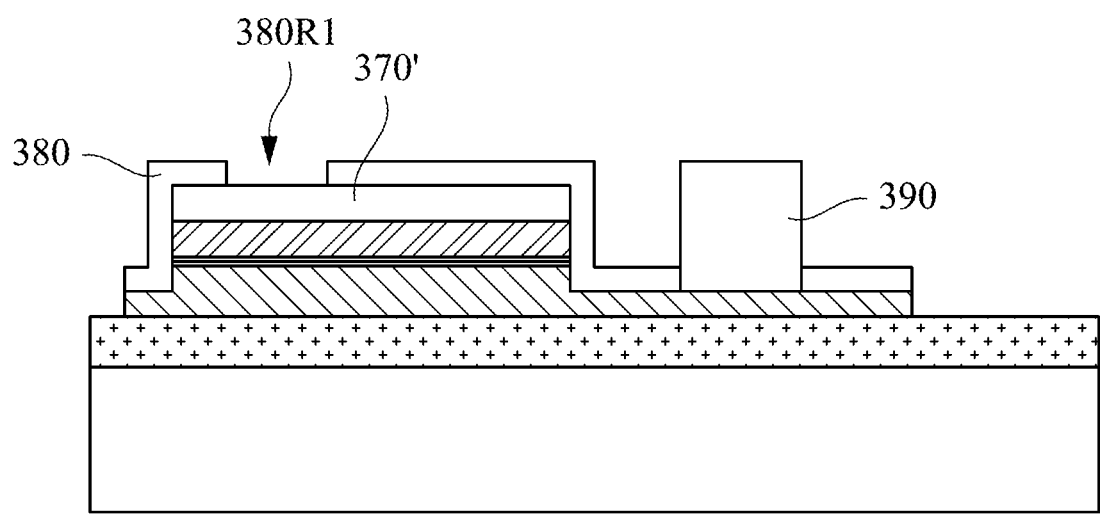

As shown in FIG. 44, an opening 380R1 is formed in the insulation layer 380 on the remaining electrode layer 370' to expose a portion of the remaining electrode layer 370'. In one embodiment, the method of forming the opening 380R1 includes, for example, the following steps. A patterned mask (not shown) is formed on the insulation layer 380, and the patterned mask has an opening (not shown) at a position where the opening 380R1 is expected to be formed. Thereafter, the opening 380R1 is formed to expose a portion of the remaining electrode layer 370'.

Figure 45:
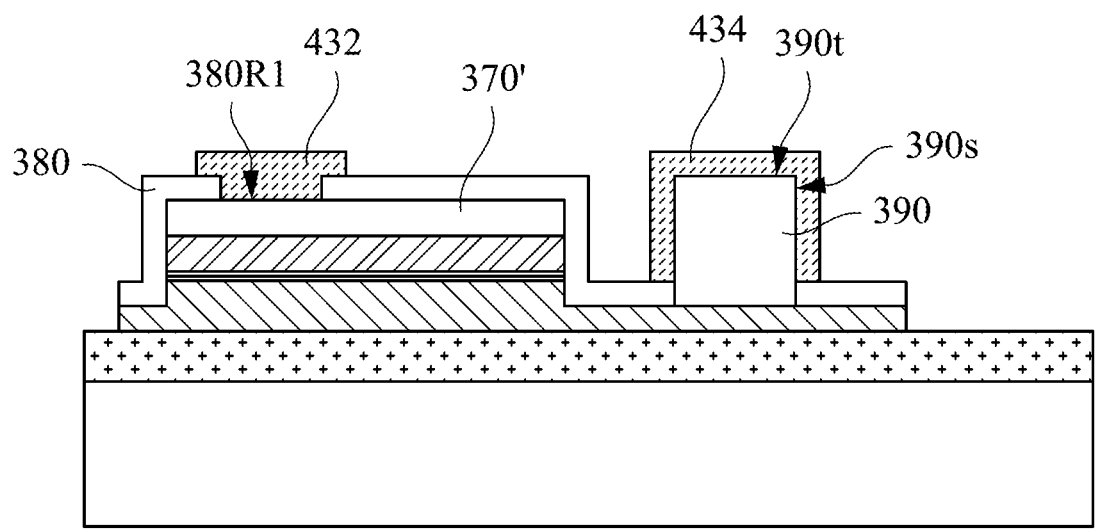

Thereafter, as shown in FIG. 45, a first conductive pad 432 is formed in the opening 380R1 and a second conductive pad 434 is formed covering the top surface 390t and sidewall 390s of the conductive block 390. In various embodiments, the first conductive pad 432 and the second conductive pad 434 may include aluminum, copper, nickel, gold, platinum, titanium, or other suitable conductive materials. In some embodiments, the first conductive pad 432 and the second conductive pad 434 may be formed by sputtering, evaporation, electroplating, or electroless plating. In one embodiment, the first conductive pad 432 and the second conductive pad 434 may be manufactured simultaneously or may be manufactured separately.

Figure 46:
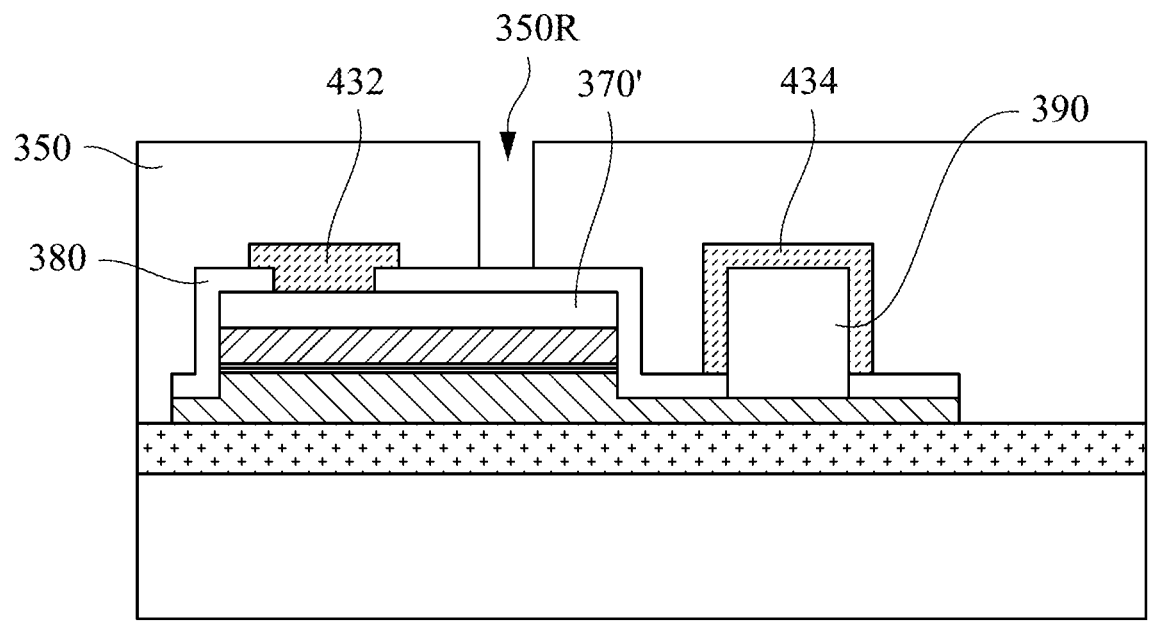

Referring to FIG. 46, a sacrificial layer 350 is formed to cover the structure illustrated in FIG. 45. More specifically, the sacrificial layer 350 covers the insulation layer 380, the first conductive pad 432 and the second conductive pad 434. It is noted that the sacrificial layer 350 has an opening 350R exposing the insulation layer 380. More specifically, the opening 350R is located between the first conductive pad 432 and the second conductive pad 434.

Figure 47:
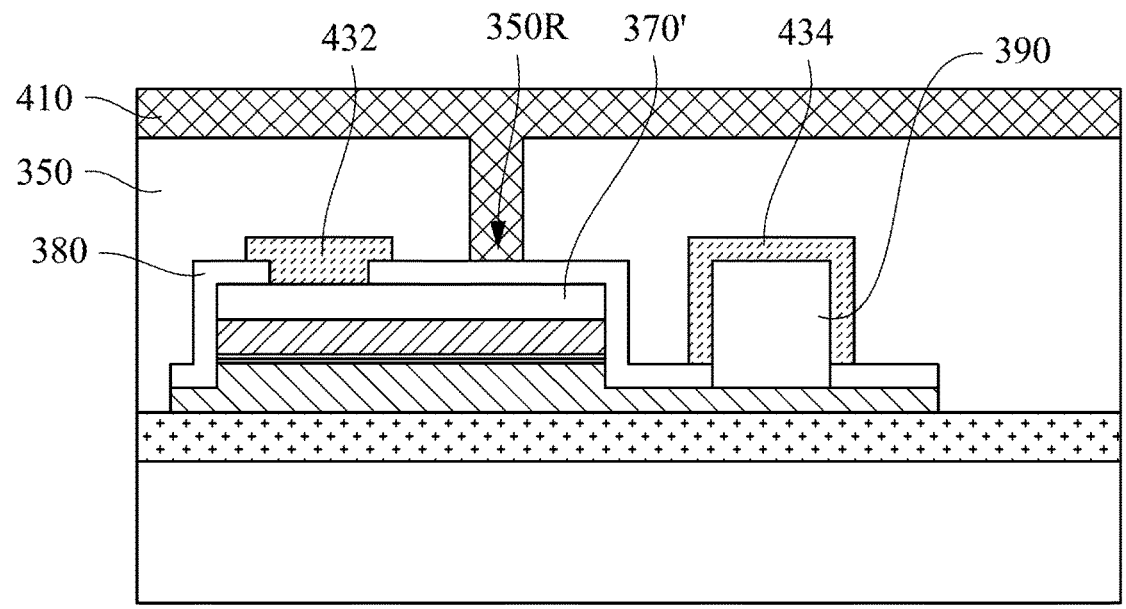

Referring to FIG. 47, a supporting layer 410 is formed to cover the sacrificial layer 350 and to fill the opening 350R. In some embodiments, the supporting layer 410 may include an insulating material, a metallic material, or other materials with supporting effect. For example, the insulating materials include silicon dioxide, silicon nitride, silicon-oxy-nitride, and epoxy resin; and the metallic materials include aluminum, titanium, gold, platinum, or nickel, but not limited thereto.

Figure 48:
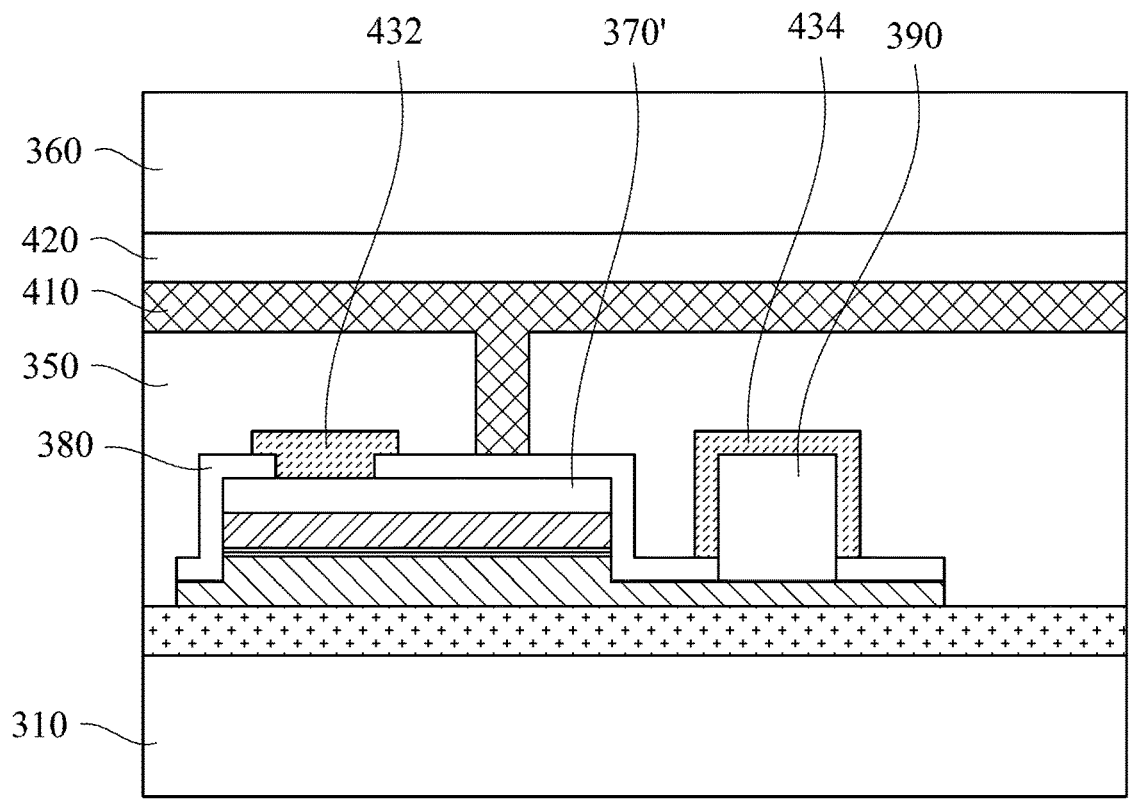
Figure 49:
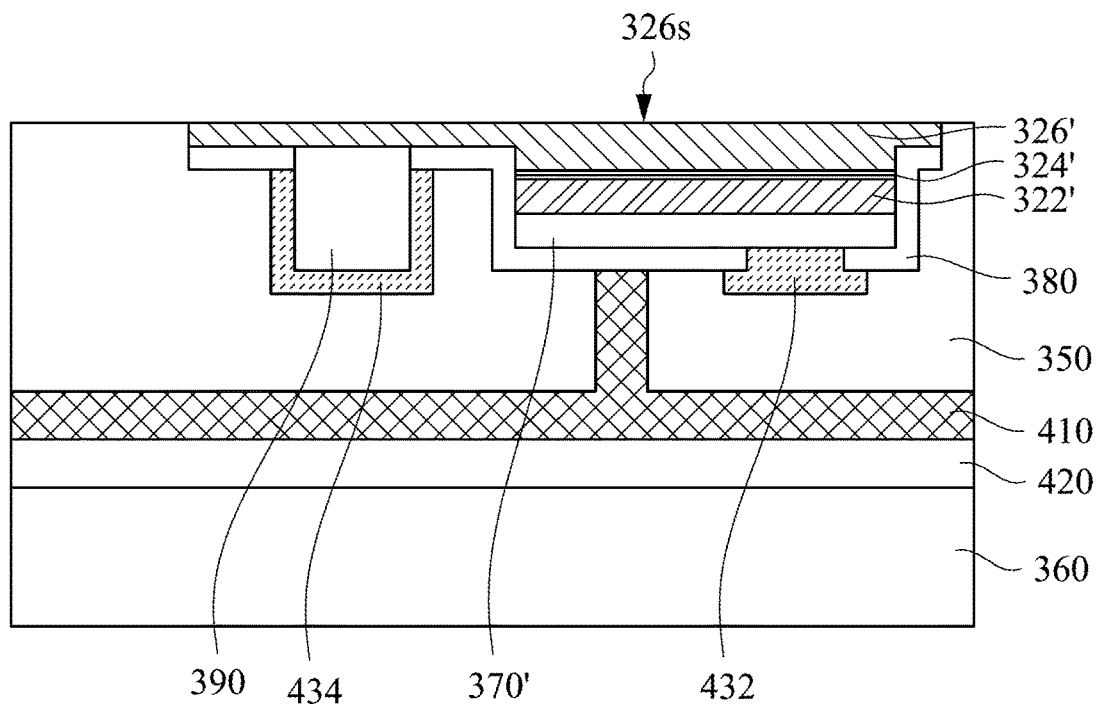

As shown in FIG. 48, a carrier substrate 360 is then formed on the supporting layer 410. In various embodiments, the carrier substrate 360 may be adhered to the supporting layer 410 by an adhesive layer 420 to improve the bonding strength between the carrier substrate 360 and the supporting layer 410. It should be stated that after forming the carrier substrate 360 on the supporting layer 410, the structure as shown in FIG. 48 is flipped upside down so that the growth substrate 310 is at the top and the carrier substrate 360 is at the bottom. Referring to FIG. 49, the growth substrate 310 and the undoped semiconductor layer 328 are then removed and a surface 326s of the remaining second type semiconductor layer 326' is exposed. In one embodiment, the exposed surface 326s of the remaining second type semiconductor layer 326' has a rough texture (not shown). In various examples, the rough texture may include regular patterns or irregular patterns.

Figure 50:
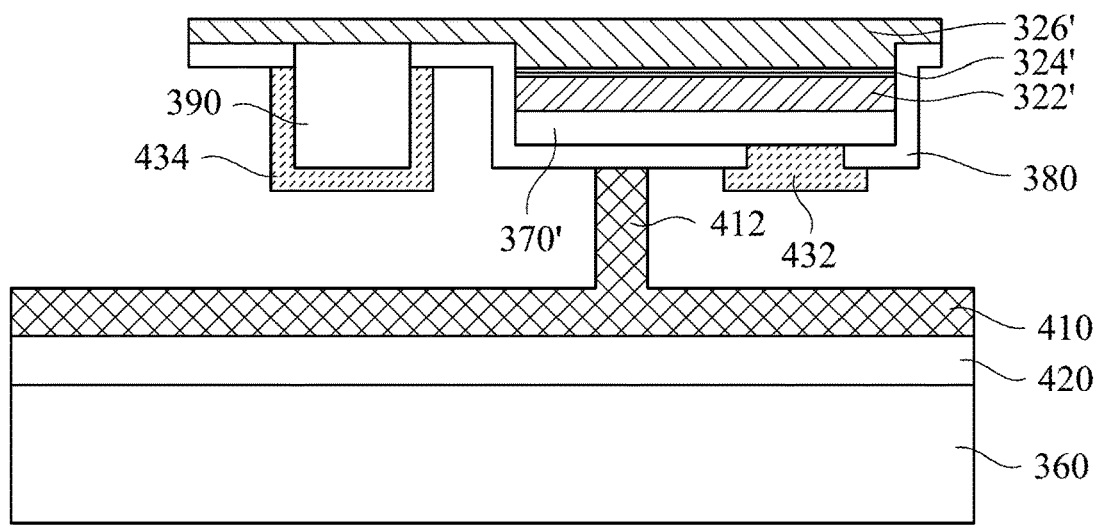

Referring to FIG. 50, the sacrificial layer 350 is removed. More specifically, the sacrificial layer 350 may be removed by using an etching solution. After the sacrificial layer 350 is etched, a portion of the supporting layer 410 may constitute a supporter 412. The light emitting diode structure expected to be formed are suspended over the supporting layer 410 by the supporter 412. Since only the supporter 412 supports the upper structure after removing the sacrificial layer 350, the supporter 412 can be easily broken. In addition, in some embodiments, merely a portion of the sacrificial layer 350 is removed. That is to say, it is not necessary to remove the complete sacrificial layer 350 as long as the supporter 412 can be broken. Next, the supporter 412 of the supporting layer 410 is intentionally broken, thereby forming an individual light emitting diode structure. In one embodiment, when the supporter 412 is broken, a residual portion of the supporter 412 may remain on the individual light emitting diode structure, and the residual portion of the supporter 412 will not be cleaned off. In another embodiment, when the supporter 412 is broken, a residual portion of the supporter 412 may not remain on the individual light emitting diode structure. In other embodiments, in order to break the supporter 412, a portion of the insulation layer 380 on the individual light emitting diode structure may be removed. In some embodiments, the first conductive pad 432 and the second conductive pad 434 in the individual light emitting diode structure may be electrically connected to the bonding substrate 170 by the first adhesive layer 162 and the second adhesive layer 164, respectively, to form the light emitting diode structure 30 as illustrated in FIG. 3. The various features of the light emitting diode structure 30 as shown in FIG. 3 have been described hereinbefore, and the details are not repeated herein. It is noted that the processes or operations described above are illustrated for examples only, and each operation can be arbitrarily changed according to the requirements. In some embodiments, additional operations can be performed before, during or after the process above.

The light emitting diode structure and the manufacturing method thereof of the present invention can be applied not only to the conventional light emitting diode and the micro light emitting diode that the size is reduced to a level of micron meters (μm), but also can be widely applied to display devices and wearable devices.

In sum, the light emitting diode structure provided in the present invention may include the distributed bragg reflector or the metal layer to direct the light emitted from the light emitting diode to emit upward, thereby increasing the light extraction efficiency. Since the width of the electrical contact layer in the light emitting diode structure of the present invention is greater than the width of the semiconductor stack, the electrical contact layer can serve as a stage for electrical contact. Furthermore, the electrical contact layer of the light emitting diode structure in the present invention may further include a double-layered conductive layer (such as the ohmic contact layer and the metal layer). The conductive layer is designed to ensure that the light emitting diode structure has a stage for electrical contact. In addition, the light emitting diode structure provided in the present invention can also utilize the second portion of the second type semiconductor layer, instead of the electrical contact layer, as a stage for electrical contact, and the surface having the rough texture exposed by the second portion of the second type semiconductor layer can enhance the light extraction efficiency.

In addition, as comparing to the conventional manufacturing method that requires two times of bonding the temporary substrate and two times of removing the temporary substrate, the manufacturing method of the light emitting diode structure provided in the present invention requires only one time of bonding the temporary substrate and only one time of removing temporary substrate. There are significant improvements in process yield, accuracy associated with the alignment and pitch spacing between the light emitting diodes. Moreover, in the process of transferring the light emitting diode structure, the transfer time of the micro light emitting diode can be reduced by using the formation of the supporter.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode structure, comprising:
a base layer having a maximum of a first width, wherein the base layer comprises a distributed bragg reflector;
an electric contact layer having a maximum of a second width and disposed on the base layer;
a semiconductor stack having a maximum of a third width and disposed on the electric contact layer, the semiconductor stack comprising a first type semiconductor layer, a light emitting layer, and a second type semiconductor layer stacked in sequence, wherein a width of the first type semiconductor layer, a width of the light emitting layer, and a width of the second type semiconductor layer are substantially smaller than or equal to the maximum of the third width; and
an insulation layer at least covering a sidewall of the base layer, a sidewall of the electric contact layer, a sidewall of the semiconductor stack, and a sidewall of the distributed bragg reflector, wherein the maximum of the second width is greater than the maximum of the third width, and the maximum of the second width is less than or equal to the maximum of the first width.

2. The light emitting diode structure of claim 1, wherein the electric contact layer is a single layer, and the maximum of the second width is substantially equal to the maximum of the first width.

3. The light emitting diode structure of claim 1, wherein the electric contact layer comprises an ohmic contact layer and a first metal layer, the ohmic contact layer with a maximum of a fourth width is disposed between the semiconductor stack and the base layer, the first metal layer with a maximum of a fifth width is disposed between the ohmic contact layer and the base layer, the maximum of the fourth width is smaller than or substantially equal to the maximum of the first width, and the maximum of the fifth width is substantially equal to the maximum of the first width.

4. The light emitting diode structure of claim 1, further comprising an electrode layer disposed on the semiconductor stack.

5. The light emitting diode structure of claim 4, wherein the electrode layer is transparent for a light emitted from the light emitting layer.

6. The light emitting diode structure of claim 4, wherein the electrode layer is a second metal layer.

7. The light emitting diode structure of claim 1, wherein the electric contact layer is transparent for a light emitted by the light emitting layer.

8. A light emitting diode structure, comprising:
a base layer having a maximum of a first width;
an electric contact layer having a maximum of a second width and disposed on the base layer;
a semiconductor stack having a maximum of a third width and disposed on the electric contact layer, the semiconductor stack comprising a first type semiconductor layer, a light emitting layer, and a second type semiconductor layer stacked in sequence, wherein a width of the first type semiconductor layer, a width of the light emitting layer, and a width of the second type semiconductor layer are substantially smaller than or equal to the maximum of the third width; and
an insulation layer at least covering a sidewall of the base layer, a sidewall of the electric contact layer, and a sidewall of the semiconductor stack,
wherein the maximum of the second width is greater than the maximum of the third width, the maximum of the second width is less than or equal to the maximum of the first width, the electric contact layer comprises an ohmic contact layer and a first metal layer, the ohmic contact layer with a maximum of a fourth width is disposed between the semiconductor stack and the base layer, the first metal layer with a maximum of a fifth width is disposed between the ohmic contact layer and the base layer, the maximum of the fourth width is smaller than or substantially equal to the maximum of the first width, the maximum of the fifth width is substantially equal to the maximum of the first width, and the maximum of the fourth width is substantially equal to the maximum of the third width.

* * * * *